United States Patent
Wu et al.

(10) Patent No.: US 8,547,727 B2
(45) Date of Patent: Oct. 1, 2013

(54) MEMRISTIVE DEVICE

(75) Inventors: Wei Wu, Palo Alto, CA (US); John Paul Strachan, Stanford, CA (US); R. Stanley Williams, Portola Valley, CA (US); Marco Florentino, Mountain View, CA (US); Shih-Yuan Wang, Palo Alto, CA (US); Nathaniel J. Quitoriano, Pacifica, CA (US); Hans S. Cho, Palo Alto, CA (US); Julien Borghetti, Mountain View, CA (US); Sagi Varghese Mathai, Palo Alto, CA (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 154 days.

(21) Appl. No.: 13/119,932

(22) PCT Filed: Dec. 12, 2008

(86) PCT No.: PCT/US2008/086667
§ 371 (c)(1),
(2), (4) Date: Mar. 18, 2011

(87) PCT Pub. No.: WO2010/068221
PCT Pub. Date: Jun. 17, 2010

(65) Prior Publication Data
US 2011/0182107 A1 Jul. 28, 2011

(51) Int. Cl.
*G11C 11/00* (2006.01)
(52) U.S. Cl.
USPC .......................................... 365/148
(58) Field of Classification Search
USPC ................................ 365/148, 158
See application file for complete search history.

(56) References Cited

U.S. PATENT DOCUMENTS

| | | | |
|---|---|---|---|
| 5,153,681 | A | 10/1992 | Kishimoto et al. |
| 5,315,131 | A | 5/1994 | Kishimoto et al. |
| 7,203,789 | B2 | 4/2007 | Snider |
| 7,352,029 | B2 | 4/2008 | Wickramasinghe et al. |
| 2008/0079029 | A1 | 4/2008 | Williams |
| 2008/0090337 | A1 | 4/2008 | Williams |
| 2011/0188294 | A1* | 8/2011 | Strachan et al. .............. 365/148 |

OTHER PUBLICATIONS

Sakamoto, Toshitsugu et al.; "Three Terminal Solid-Electrolyte Nanometer Switch"; Electron Devices Meeting, 2005. IEDM Technical Digest. IEEE International; Dec. 2005; 475-478: IEEE; USA.
Sakamoto, Toshitsugu et al.; "NanoBridge Technology for Reconfigurable LSI", NEC Technical Journal; 2007; 72-75; vol. 2; No. 1.

* cited by examiner

*Primary Examiner* — Anthan Tran

(57) ABSTRACT

A memristive routing device includes a memristive matrix, mobile dopants moving with the memristive matrix in response to programming electrical fields and remaining stable within the memristive matrix in the absence of the programming electrical fields; and at least three electrodes surrounding the memristive matrix. A method for tuning electrical circuits with a memristive device includes measuring a circuit characteristic and applying a programming voltage to the memristive device which causes motion of dopants within the memristive device to alter the circuit characteristic. A method for increasing a switching speed of a memristive device includes drawing dopants from two geometrically separated locations into close proximity to form two conductive regions and then switching the memristive device to a conductive state by applying a programming voltage which rapidly merges the two conductive regions to form a conductive pathway between a source electrode and a drain electrode.

20 Claims, 19 Drawing Sheets

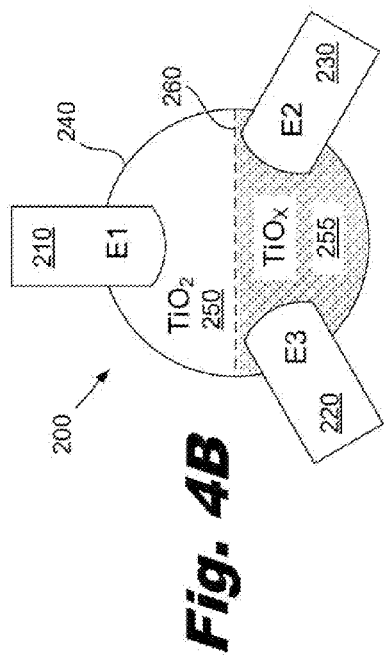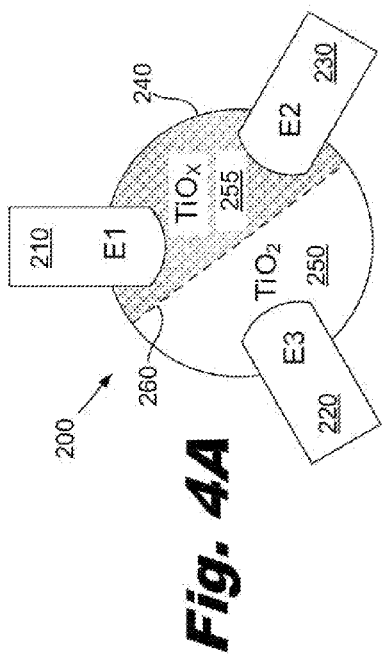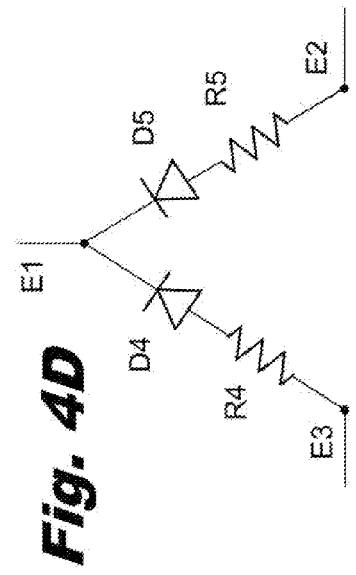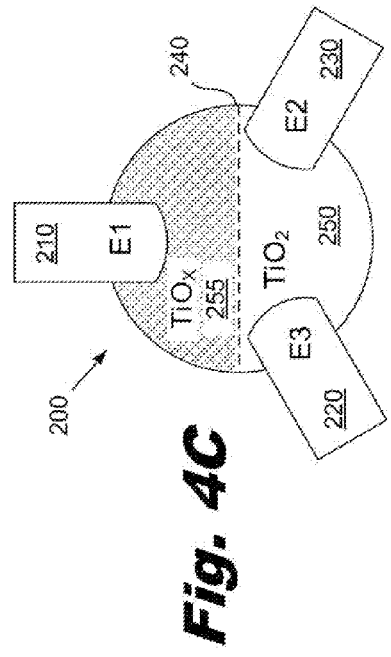
Fig. 4A
Fig. 4B
Fig. 4C
Fig. 4D

MEMRISTIVE DEVICE

BACKGROUND

The presence of dopants within an insulating or semiconducting matrix can dramatically increase the electrical conductivity of the matrix. Dopants can be introduced into a matrix or moved within a matrix to dynamically alter the electrical operation of an electrical device. In some circumstances, the motion of dopants can be induced by the application of a programming electrical field across a suitable matrix. After removal of the electrical field, the location and characteristics of the dopants remain stable until the application of another programming electrical field. This phenomenon is most strongly evident in nanometer scale devices and allows the device to "remember" past electrical conditions.

There is a long felt but unfulfilled need for electrical components which retain a memory of past conditions. For example, these electrical components could be used to store data, calibrate circuits, or provide self programming, fuzzy logic, or neural learning capabilities.

BRIEF DESCRIPTION OF THE DRAWINGS

The accompanying drawings illustrate various embodiments of the principles described herein and are a part of the specification. The illustrated embodiments are merely examples and do not limit the scope of the claims.

FIGS. 4A-4D are diagrams of various operational configurations of an illustrative rotary switch, according to one embodiment of principles described herein.

Throughout the drawings, identical reference numbers designate similar, but not necessarily identical, elements.

DETAILED DESCRIPTION

Figure 1A:
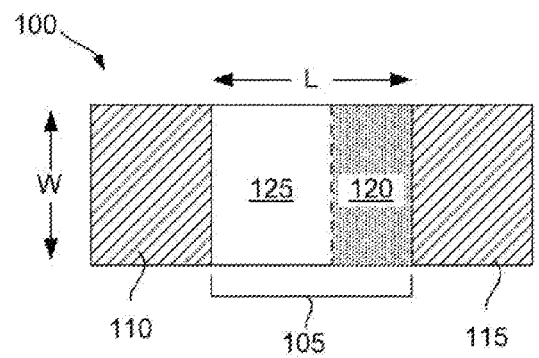
FIGS. 1A-1E are illustrative diagrams which show the fundamental operating principles and configurations of a memristive device, according to one embodiment of principles described herein.

The presence of dopants within an insulating or semiconducting matrix can dramatically increase the electrical conductivity of the matrix. Dopants can be introduced into a matrix or moved within a matrix to dynamically alter the electrical operation of an electrical device. In some circumstances, the motion of dopants can be induced by the application of a programming electrical field across a suitable matrix. After removal of the electrical field, the location and characteristics of the dopants remain stable until the application of another programming electrical field.

Throughout the specification and appended claims the term "memristor" or "memristive" is used to describe a combination of an insulating/semiconductor matrix and a dopant which exhibits dopant motion in the presence of a programming electrical field and long term dopant stability within the matrix when the programming field is removed. The memristive effect is most strongly evident in nanometer scale devices and allows the device to "remember" past electrical conditions.

There is a long felt but unfulfilled need for electrical components which retain a memory of past conditions. For example, these electrical components could be used to store data, calibrate circuits, or provide self programming, fuzzy logic, or neural learning capabilities. An example of such an electrical component may be a solid state memory device with high storage density, no power requirement for long term data retention, and fast access times. Other examples may include: switching devices, self programming circuit elements, memory devices capable of multi-state storage; solid state elements which can be used to tune circuits, analog neuronal computing devices which share fundamental functionalities with the human brain; and electronic devices for applying fuzzy logic processes.

According to one illustrative embodiment, a memristive device may be a programmable resistor or "memristor." A memristor is the fourth fundamental circuit element, joining the capacitor, resistor, and inductor. The term "memristor" is derived from the combination of the two terms "memory" and "resistor." The memristor has properties that cannot be duplicated by the combination of the other fundamental circuit elements. Unlike the other fundamental circuit elements, the memristor carries a memory of past electrical fields which have been applied. As described in U.S. Patent App. Pub. No. 20080079029, entitled "Multi-terminal Electrically Actuated Switch" to R. Stanley Williams, which is hereby incorporated in its entirety, memristor devices are based on dopant motion within a matrix material. Specifically, when an electrical field of sufficient magnitude is applied to a memristor, the dopants within the matrix material are displaced. When the electrical field is removed from the circuit, the displacement of the dopants allows the memristor "remember" how much voltage was previously applied and for how long. The motion of these dopants alters the electrical resistance of the memristor. The dopants remain in this displaced state over long periods of time, thereby retaining a memory of the past electrical fields applied to the device. Until another electrical field is applied to the memristor which has sufficient intensity or duration to induce dopant motion, the resistance characteristics of the memristor are stable.

In the following description, for purposes of explanation, numerous specific details are set forth in order to provide a thorough understanding of the present systems and methods. It will be apparent, however, to one skilled in the art that the present apparatus, systems and methods may be practiced without these specific details. Reference in the specification to "an embodiment," "an example" or similar language means that a particular feature, structure, or characteristic described in connection with the embodiment or example is included in at least that one embodiment, but not necessarily in other embodiments. The various instances of the phrase "in one embodiment" or similar phrases in various places in the specification are not necessarily all referring to the same embodiment.

FIG. 1A shows an illustrative two-terminal memristive switch (100). According to one embodiment, the two-terminal memristive switch (100) is comprised of a first electrode (110) and second electrode (115) which are in electrical and physical contact with the memristive matrix (105). The memristive matrix (105) is comprised of a primary material (125) which is not intentionally doped and a highly doped secondary region (120). Throughout the specification and appended claims, the term "memristive matrix" describes a thin film of a material that is electronically semiconducting or nominally electronically insulating and also a weakly ionic conductor. The memristive matrix is capable of transporting and hosting ions that act as dopants to control the flow of electrons through the switch. The basic mode of operation is to apply an electrical field (the drift field, which may exceed some threshold for enabling the motion of the ions in the memristive matrix) across the switch large enough to cause an ionic species to be transported within the memristive matrix via ionic transport. The ionic species are specifically chosen from those that act as electrical dopants for the memristive matrix, and thereby change the electrical conductivity of the matrix from low conductivity (i.e. not intentionally doped semiconductor or insulator—switch-OFF configuration) to high conductivity (doped to provide a higher conductivity—switch-ON configuration) or from high electrical conductivity to low conductivity (switch-ON to switch-OFF). Furthermore, the memristive matrix and the dopant species are chosen such that the drift of the dopants within the memristive matrix is possible but not too facile, to ensure that the switch will remain in whatever state it is set for a reasonably long time, perhaps many years at room temperature. This ensures that the switch is nonvolatile, that is, that it holds its state after the drift field has been removed.

Illustrative examples of suitable memristive combinations are given in Table 1, below. The table lists compatible primary materials, secondary materials, and dopant species for each memristive combinations. The primary material is typically a highly insulating stoichiometric compound. The secondary material is the source of the doping species for the primary material.

TABLE 1

List of Examples of Compatible Primary and Secondary Materials and Dopant Species

| Primary Material | Secondary Material | Dopant Species |
| --- | --- | --- |
| $TiO_2$ | $TiO_{2-x}$ | Oxygen Vacancies |
| $ZrO_2$ | $ZrO_{2-x}$ | Oxygen Vacancies |
| $HfO_2$ | $HfO_{2-x}$ | Oxygen Vacancies |
| $SrTiO_3$ | $SrTiO_{3-x}$ | Oxygen Vacancies |
| GaN | $GaN_{1-x}$ | Nitrogen Vacancies |
| CuCl | $CuCl_{1-x}$ | Chlorine Vacancies |
| GaN | GaN:S | Sulfide Ions |

Applying a high voltage across the electrodes (110, 115) causes both electron current to flow and dopant motion through the matrix material, whereas at a low voltage bias the dopant motion is negligible, which allows the characteristics of the memristor to remain unchanged.

These dopants may be impurity atoms such as hydrogen or some other cation species, such as alkali or transition metals, which act as electron donors for the matrix material. Additionally or alternatively, the dopants may be anion vacancies, which act as donors within the matrix. It is also possible to drive anionic species into the matrix material, which will become electron acceptors (or hole donors). The matrix material may be a thin film (generally less than 50 nm thick), and is in many cases nanocrystalline, nanoporous, or amorphous. The mobility of the dopant species in such nanostructured materials is much higher than in a bulk crystalline material, since diffusion can occur through grain boundaries, pores, or through local structural imperfections in an amorphous material. Also, because the film is so thin, the amount of time required to drift enough dopants into or out of a local region of the film to substantially change its conductivity is relatively rapid (e.g., the time t required for a diffusive process varies as the square of the distance covered, so the time to diffuse one nanometer is one-millionth the time required to diffuse one micrometer). Another advantage of nanometer scale memristive devices is that a large electrical field can be produced by a relatively small applied voltage. For example, a dopant may require an electrical field intensity of 100,000 volts per centimeter to move within the matrix. If the distance between two electrodes is 100 nanometers, only a voltage bias of 1 Volt will produce the required electrical field intensity.

There can be a variety of junctions within the memristive device where two dissimilar materials are joined to each other. For example, the memristive matrix can be contacted by electrodes which are made from metal or semiconductors. Additionally, within the matrix, regions with high concentrations of mobile dopants can contact regions which have been depleted of mobile dopants. In some cases, contact by dissimilar materials can deplete a doped material of free charge carriers, so in fact the doped material has a local net charge that depends on the identity of the dopants—positive in the case of donors and negative in the case of acceptors. These junctions electrically resemble Schottky barriers. The traditional description of a metal-semiconductor Schottky barrier is modified by the fact that the materials are structured at the nanometer scale, and so the structural and electrical properties are not averaged over the large distances over which the theory of semiconductor-metal contacts have been developed.

Conduction of electrons through the matrix material is via quantum mechanical tunneling of the electrons. When a semiconducting matrix material is essentially intrinsic, the tunneling barrier is high and wide, and thus the conductivity through the switch is low (OFF state). When a significant number of dopant species have been injected into the semiconductor, the width and perhaps the height of the tunneling barrier are diminished by the potential of the charged species. This results in an increase of the conductivity of the switch (ON state).

As noted above, the matrix material has certain properties that are useful in the practice of the present invention. One of these properties of the material is that it is a weakly ionic conductor. The definition of a weakly ionic conductor is based on the application for which a switch is designed. The mobility and the diffusion constant for a species in a lattice are directly proportional to one another, via the "Einstein relation". Thus, if the mobility of ionized species in a lattice is very high, so is the diffusion constant. In general, it is desired for a switching device to stay in a particular state, ON or OFF, for an amount of time that may range from a fraction of a second to years, depending on the application. Thus, the diffusion constant for such a device is, in an embodiment, low enough to ensure the desired level of stability, to avoid inadvertently turning the device from ON to OFF or vice versa via ionized species diffusion, rather than by intentionally setting the state of the switch with a voltage pulse. Therefore, a "weakly ionic conductor" is one in which the ion mobility, and thus the diffusion constant, is small enough to ensure the stability of the ON or OFF state of the device for as long as necessary under the desired conditions (e.g., the device does not change state because of diffusion of the dopants). "Strongly ionic conductors" would have large ionized species mobilities and thus would not be stable against diffusion.

According to one embodiment, the memristive matrix (105) may be initially comprised of two separate materials or layers. A first insulating layer (125) is has very few dopants and prevents electrical current from flowing between the two electrodes (110, 115). A second highly doped layer (120) is conductive and serves as a source of dopants which can be moved into the first insulating layer (125) to change the overall electrical conductivity of the memristive matrix (105). Consequently, in the configuration illustrated in FIG. 1A is the memristive switch (100) is open.

According to one illustrative embodiment, the first insulating layer (125) is comprised of intrinsic titanium dioxide ($TiO_2$). Intrinsic titanium dioxide ($TiO_2$) is an insulator, having a resistivity of approximately $10^{12}$ ohms per centimeter at 25° C. The second highly doped layer (120) is comprised of oxygen depleted titanium dioxide ($TiO_{2-x}$), where the subscript "x" indicates that the titanium dioxide has a small deficit of oxygen atoms in the crystal structure. These positively charged oxygen vacancies are the dopants in this embodiment. Even relatively low concentrations of oxygen vacancies (below 2%) result in a large increase of the electrical conductivity within the titanium dioxide. The oxygen vacancies act as electron donors, thus $TiO_{2-x}$ is an n-type semiconductor. Additionally, the oxygen vacancies move within the titanium dioxide under the influence of electrical fields. For example, electrical fields between 10,000 volts per centimeter and 100,000 volts per centimeter may be sufficient to physically relocate the oxygen vacancies.

The memristive matrix (105) has a length of "L" and a width of "W" as shown in FIG. 1A. For purposes of illustration only, assume that the length "L" is 100 nanometers and the width "W" is approximately 50 nanometers. Consequently, to apply an electrical field of 100,000 volts/centimeter across the memristive material (105), a voltage bias of 1 volt would be applied across the electrodes (110, 115).

The dopants may originate from a variety of sources. The matrix material may be initially formed with a number of dopants distributed throughout the matrix. A programming electrical field can then be used to displace the dopant to form intrinsic regions and doped regions within the matrix. In other embodiments, the matrix material may be deposited in its intrinsic form. A sacrificial layer is then deposited onto the intrinsic material which provides the dopants by chemically reacting with the intrinsic matrix. For example, a layer of intrinsic titanium dioxide may be deposited, followed by a layer of aluminum. The elemental aluminum has a high affinity for oxygen molecules and will chemically combine with a number of oxygen molecules which were previously bound within the titanium dioxide matrix to create aluminum oxide. This creates oxygen vacancies within the titanium dioxide matrix. The oxygen vacancies then act as dopants within the titanium dioxide matrix. The aluminum/aluminum oxide layer can be striped from the matrix. In other embodiments, the aluminum may remain within the memristive device or be used as an electrode.

In an alternative embodiment, the matrix may be made with an intrinsic layer and a separate doped layer. The application of a programming electrical field to the memristive device then allows the dopants to be distributed as desired throughout the matrix. Additionally or alternatively, a dopant source particles or layers may be included in the memristive device. The dopant source particles or layers may act as a source of dopants in a variety of ways. For example, the dopant source particles or layers may have the ability to generate large numbers dopants under the influence of an external field of high enough strength. Typically, this electrical field is much higher than the programming electrical field. For example, a number of titanium particles or layers could be included within the intrinsic titanium dioxide matrix. These titanium particles would then react with a portion of the oxygen atoms contained within the intrinsic titanium dioxide matrix to produce oxygen vacancies.

Additionally, a passivation layer may be formed over a memristive device to prevent atmospheric oxygen or other contaminants from chemically altering the composition of the memristive device. For example, if a passivation layer is not present, an oxygen depleted titanium dioxide matrix may lose dopants over time as a result of atmospheric oxygen filling the oxygen vacancies.

The electrodes (110, 115) may be constructed from a variety of conducting materials, including but not limited to: metals, metal alloys, highly doped semiconductors, composite materials, nanostructured materials, or other suitable materials. According to one illustrative embodiment, the electrodes are formed from platinum.

Figure 1B:
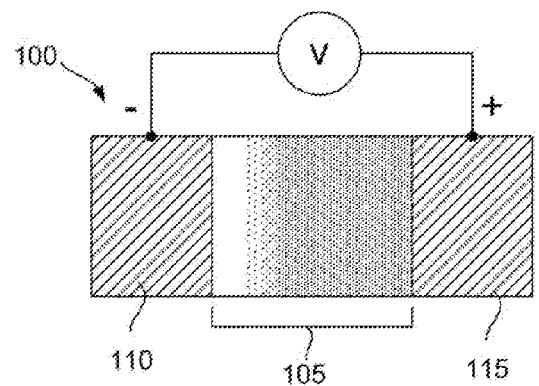

FIG. 1B illustrates the movement of the oxygen vacancies from the highly doped region (120) into the intrinsic region (125) as a result of an applied electrical field. The polarity and voltage difference which is applied across the memristive matrix (105) may vary according to a variety of factors including, but not limited to: material properties, geometry, dopant species, temperature, and other factors. Where titanium dioxide is used as the matrix, the oxygen vacancies have a positive charge, consequently a positive voltage is applied to the right electrode (115) to repulse the oxygen vacancies and drive them toward the left electrode (110). A negative voltage may also be applied to the left electrode (110) to further increase the electrical field and draw the positively charged vacancies toward the left electrode (110).

Figure 1C:
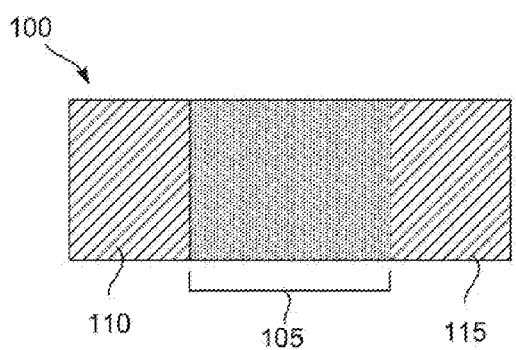

FIG. 1C illustrates the memristive switch in the fully "ON" position, with the dopants fully distributed throughout the memristive matrix (105). The left and right electrodes (110, 115) are electrically connected and can pass lower voltage electrical signals through the memristive matrix (105). As discussed above, the location and distribution of the dopants can remain stable over long periods of time or until another programming voltage is applied. The memristive matrix (105) is not a perfect conductor and still interposes an electrical resistance between the two electrodes (110, 115) in the fully "ON" state. This electrical resistance may be influenced by a variety of factors, including, but not limited to the geometry of the memristive matrix and the electrodes, the dopant concentration, the distribution of the dopants through out the memristive matrix, the species of dopant, the electrical characteristics of the matrix material, the temperature of the device, and other factors.

Figure 1D:
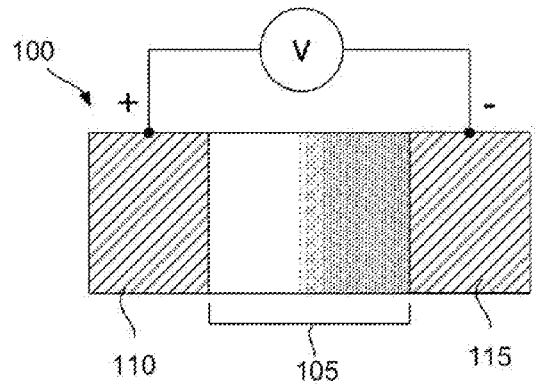

FIG. 1D illustrates the application of a programming voltage to the memristive switch (100). In this case, the purpose of the programming voltage is to return the memristive switch (100) to the fully "OFF" configuration similar to that illustrated in FIG. 1A. Consequently, the applied programming voltage has an opposite polarity from that illustrated in FIG. 1B. A positive voltage is applied to the left electrode (110) and a negative voltage is applied to the right electrode (115), thereby driving the dopants toward the right electrode (115). This returns the left most portion of the memristive matrix (105) to its intrinsic and insulating state. The memristive switch (100) is then in a fully so "OFF" configuration.

The transition from the fully "OFF" to fully "ON" configuration or visa versa, is not instantaneous, but can have a number of intermediate states in which the memristive matrix acts as a finite resistance between the two electrodes. These intermediate states may be produced by varying the programming voltage applied across the two electrodes (110, 115) and/or varying the time period during which the programming voltage is applied.

In some circumstances, it can be desirable for the memristive matrix to retain some electrical resistance. For example, in the fully "ON" configuration illustrated in FIG. 1C, if the resistance of the memristive matrix (105) is negligible, the two electrodes (110, 115) and the memristive matrix (105) can be thought of as a single electrical conductor. The application of a programming voltage across the two electrodes (110, 115) results in a large flow of current through the switch, but very low voltage difference between the two electrodes (110, 115). Consequently, the electrical gradient between the left and right electrodes (110, 115) is small, making it very difficult move the dopants away from either electrode. This would result in the memristive switch (100) being permanently stuck in a fully "ON" or short circuited configuration.

To prevent the "short circuiting" scenario described above and to provide additional functionality to the switching device, a number of additional electrodes and memristive geometries could be used.

Figure 1E:
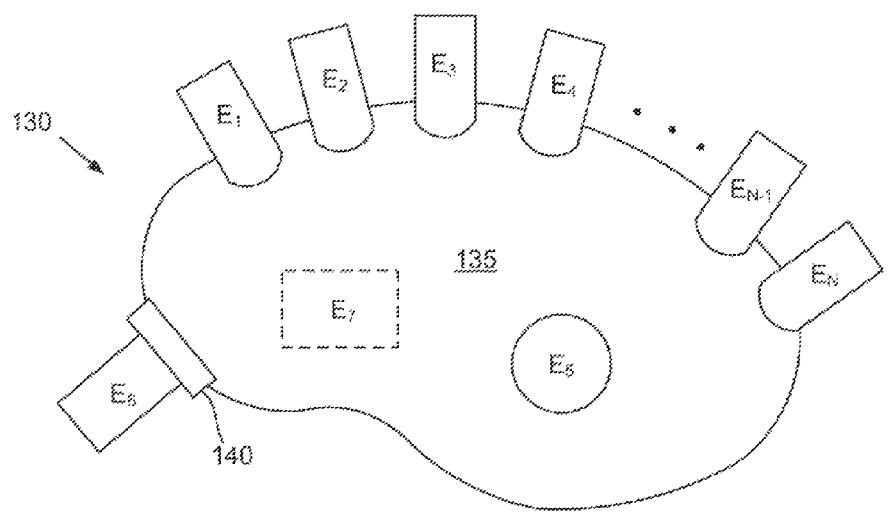

FIG. 1E shows a generalized memristive switch (130) which is comprised of a memristive matrix (135) and a number of electrodes (E1, E2, E3 ... $E_N$). The memristive matrix (135) may have any of a number of geometries. Additionally, the electrodes (E1, E2, E3 ... $E_N$) may have a number of configurations. For example, electrode E1 is one of a series of electrodes which are arranged around the perimeter of the memristive matrix (135). The electrode E1 is in electrical and mechanical contact with memristive matrix (135) over at least a portion of its surface. Electrode E5 is surrounded in at least one plane by the memristive matrix (135). Electrode E6 is separated from the memristive body by an insulating layer (140). The insulating layer (140) prevents the flow of electrical current from the electrode E6 into the memristive matrix (135) and visa versa. The electrode E6 may be particularly useful as a dedicated programming electrode because it can never be short circuited by a high concentration of dopants. Rather, when a voltage is applied to electrode E6, an electrical field will be produced which can influence the motion and position of the dopants within the memristive body. Electrode E7 illustrates an electrode which is above or below the memristive device. The electrode E7 may be insulated from the memristive matrix (135) or be in electrical contact with the memristive matrix (135).

A memristor device with multiple electrodes can be used in a variety of functions and geometries. In one embodiment, the memristor device can be configured as a switch that can be self-configured to conduct electrical current from one or more source electrodes to one or more drain electrodes.

Figure 2:
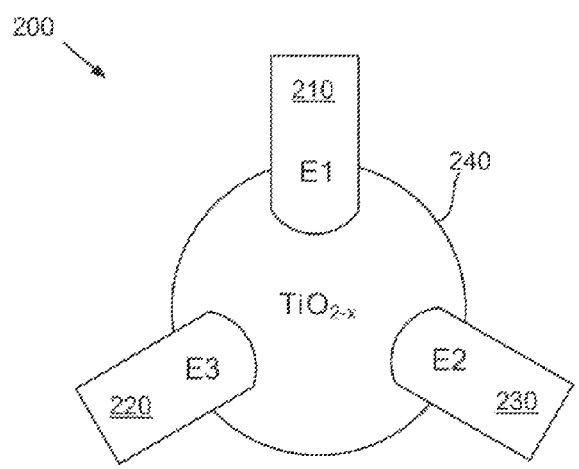
FIG. 2 is a diagram of an illustrative rotary switch based on memristive principles, according to one embodiment of principles described herein.

FIG. 2 is a diagram of an illustrative rotary switch (200) that contains a central memristive matrix (240) which is surrounded by three electrodes E1, E2, and E3 (210, 220, 230), each of which is in contact with the central memristive matrix (240). As discussed above, the memristive matrix (240) may contain a number of dopants or charge carriers. According to one illustrative embodiment, the memristive matrix (240) is made up of titanium dioxide ($TiO_2$) which has a number of oxygen vacancies. This oxygen depleted titanium dioxide is designated as $TiO_{2-x}$, where the subscript "x" shows the removal of a percentage of oxygen molecules from the original stoichiometric composition. As discussed above, stoichiometric titanium dioxide ($TiO_2$) is an insulator, having a resistivity of approximately $10^{12}$ ohms per centimeter at 25° C. The oxygen deficiency in $TiO_{2-x}$ introduces an excess of electrons in the material, resulting in an increase of the electrical conductivity. The oxygen vacancies act as electron donors, thus $TiO_{2-x}$ is an n-type semiconductor. The oxygen vacancies move within the titanium dioxide under the influence of electrical fields. For example, electrical fields between 10,000 volts per centimeter and 100,000 volts per centimeter could be sufficient to physically relocate the oxygen vacancies.

Figure 3A:
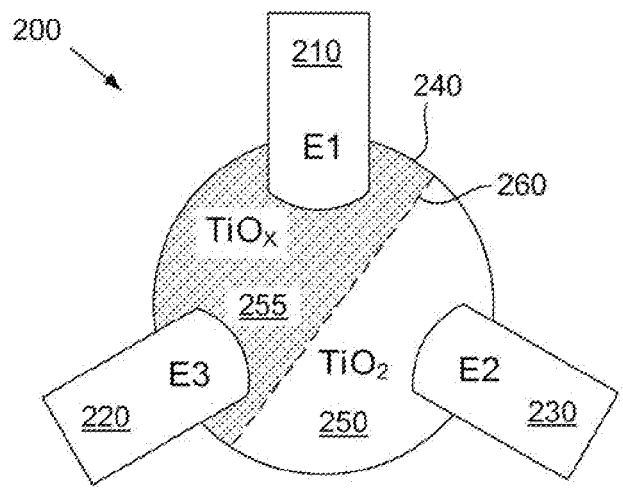
FIGS. 3A-3B show a diagram of an illustrative rotary switch and a corresponding circuit diagram, respectively, according to one embodiment of principles described herein.

FIG. 3A shows the result of an application of a positive programming voltage to electrode E2 and lower or negative voltages to electrode E1 and E3. This generates an electrical field which drives the oxygen vacancies toward electrodes E1 and E3. The motion of the oxygen vacancies creates two distinct regions within the central memristive matrix: an intrinsic region (250) close to electrode E2 which is primarily stoichiometric titanium dioxide ($TiO_2$) which has a very low electrical conductivity and a doped region (255) which has a relatively high concentration of oxygen vacancies and exhibits much greater electrical conductivity.

For illustrative and explanatory purposes, a straight dotted line (260) is used to show the division of the two regions (250, 255) of the memristor matrix (140). However, the motion of the vacancies is dependent on the gradients of the applied electrical field, which may not produce a straight or well defined boundary between the two regions (250, 255).

Figure 3B:
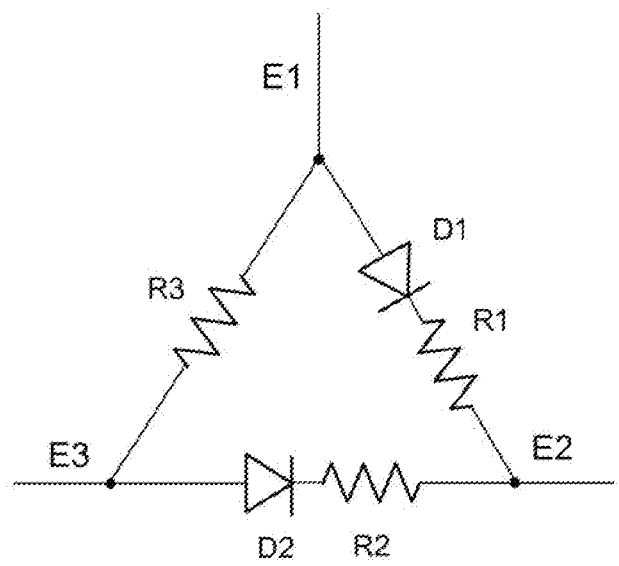

FIG. 3B shows an illustrative diagram of the electrical behavior of the rotary switch (200) using standard electrical symbols. The diagram shows the electrical paths between the three electrodes, E1, E2, and E3. The electrodes E1, E2, and E3 are represented as nodes. Electrode E3 is connected to electrode E1 by a resistor R3, which represents the resistance of the oxygen depleted titanium dioxide region (255). The resistance R3 is relatively small, allowing electrical current to flow between electrode E3 and electrode E1.

Electrode E1 is also connected to electrode E2. A diode D1 and a resistor R1 represent the electrical behavior of the portions of the memristive matrix which separate electrode E1 from electrode E2. The diode D1 represents the transition between the oxygen depleted region (255) and the intrinsic region (250). This transition can be modeled as a Schottky barrier or diode. The properties of the transition depend on the work function of the materials, the bandgap of the materials, and the difference in the concentration of the dopants in the two regions. This transition creates a preferred direction for current flow, which in this case, is from electrode E1 to electrode E2. Resistor R1 is in series with diode D1 and has a significantly higher value than R3 due to the much higher resistance of the intrinsic titanium dioxide region (250).

Similarly, electrode E3 is connected to electrode E2. Due to the symmetry of the rotary switch the path between E3 and E2 is substantially similar to the path between E1 and E2. Specifically, current flow from E2 to E3 and visa versa is substantially prevented by the combination of the resistor and diode (R2, D2).

The diode behavior of the transition prevents the flow of electrical current from E2 to the other electrodes, as shown by diodes D1 and D2. The significantly higher resistance of R1 and R2 results in the majority of the electrical current flow to occur between electrodes E3 and E1. There is no transition between highly doped and intrinsic titanium dioxide between electrodes E3 and E1; consequently there is no preferred current direction in the connection between E3 and E1.

As illustrated by FIGS. 3A and 3B, the rotary switch has been self configured to form a low resistance connection between E3 and E1, while limiting the current flow to and from E2.

FIGS. 4A, 4B, and 4C illustrate other configurations of the rotary switch (200). FIG. 4A shows a configuration in which the oxygen vacancies have been driven toward electrodes E1 (210) and E2 (230), thereby creating a connection between electrodes E1 and E2 while isolating electrode E3 (220). FIG. 4B shows a configuration where the oxygen vacancies have been driven toward electrodes E3 and E2, thereby creating a connection between electrodes E3 and E2.

FIG. 4C shows a configuration in which the oxygen vacancies are driven toward a single electrode E1 (210), which results in the electrical isolation of each of the electrodes E1, E2, and E3. In this configuration, only electrode E1 is within the conductive $TiO_x$ region (255). The remaining electrodes E3 and E2 are within the insulating region (250) and are electrically isolated from each other and electrode E1 FIG. 4D shows an electrical diagram which illustrates the electrical characteristics of the paths between the three electrodes E1, E2, and E3. The high resistance of the intrinsic titanium oxide region (250) is shown by omitting any conduction path between electrodes E3 and E2. The resistance of the shorter path through the intrinsic titanium dioxide region to the transition (240) is represented by the resistances R4 and R5. The transition (240) itself is shown as diodes D4 and D5. The resistances R4 and R5 are still very significant and prevent substantial current flow from E3 and E2 to E1. The combination of the resistances (R4, R5) and diodes (D4, D5) prevent current from flowing E1 to the other electrodes. Consequently, the configuration illustrated in FIGS. 4C and 4D represents an "OFF" or disconnected state of the rotary switch.

Figure 5B:
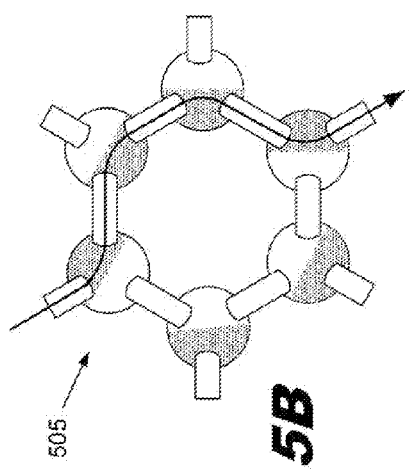
FIGS. 5A-5D are diagrams of illustrative routing structures made up of rotary switches, according to one embodiment of principles described herein.
Figure 5D:
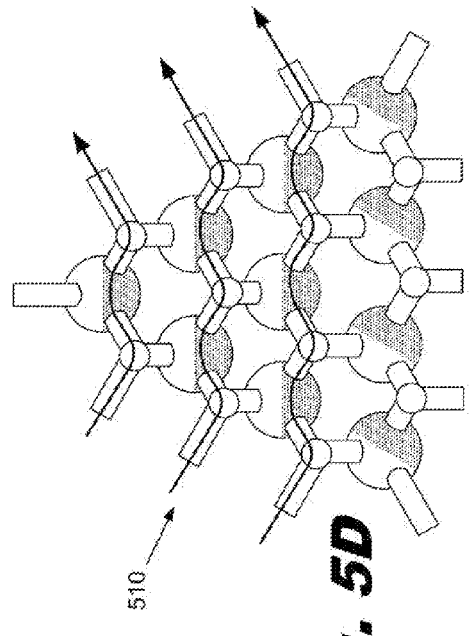
Figure 5A:
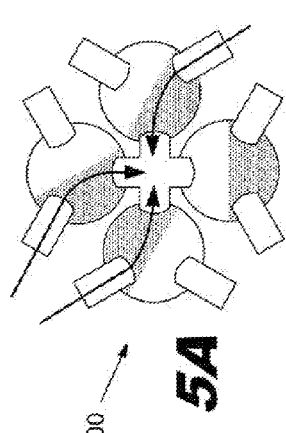

FIGS. 5A-5D represent switching configurations in which a number of rotary switches are combined. FIG. 5A shows four rotary switches which share a common electrode to form a multiplexer/de-multiplexer (500). The shaded portions of the rotary switches indicated conductive doped regions of the switch. The multiplexer/de-multiplexer (500) is configured to combine up to four signals from the peripheral electrodes and output the combined signal on the shared electrode. Conversely, the multiplexer/de-multiplexer (500) could distribute a signal received from the shared electrode and distribute it to up to four peripheral electrodes. In the configuration shown in FIG. 5A, three rotary switches are configured to connect one of their perimeter electrodes to the central electrode. The dark arrows illustrate the flow of current through the multiplexer/de-multiplexer (500).

FIG. 5B shows a switching configuration in which six rotary switches are connected in a hexagon switching configuration (505). The hexagon switching configuration (505) can be configured to direct an input from any one of six inputs to any one of the five remaining electrodes.

Figure 5C:
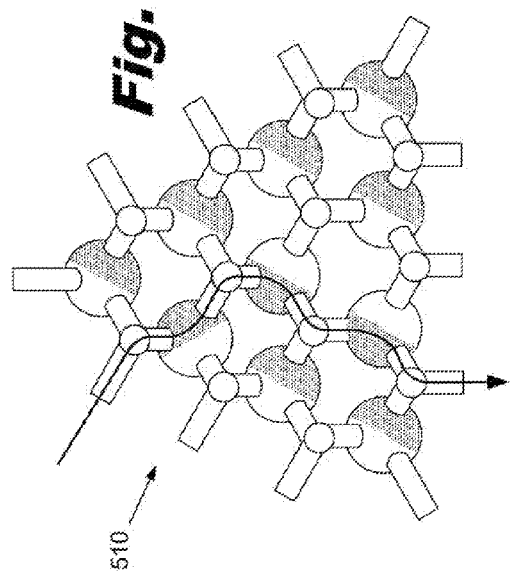

FIGS. 5C and 5D show a pyramidal switching configuration (510) in which 10 rotary switches are interconnected. The pyramidal switching configuration (510) shown in FIG. 5C has a single current flow being directed from a first input electrode to a second output electrode. The pyramidal switching configuration (510) can be configured to route an input from any one of 12 perimeter electrodes to one or more of the remaining 11 perimeter electrodes. Additionally, the pyramidal switching configuration can combine signals from two or more electrodes and output the combined signals from one or more of the remaining electrodes. Consequently, the pyramidal switching configuration (510) can also be flexibly configured as multiplexer/de-multiplexer by applying the appropriate programming voltages at the electrodes.

FIG. 5D shows multiple current paths being directed simultaneously through the pyramidal switching configuration (510). The multiple current paths need not flow in parallel but could be directed in a variety of directions. Additionally, the rotary devices need not be in static configuration, but could be actively switched while conducting electrical current. For example, the electrodes which are not actively conducting current could be used as programming electrodes. A voltage bias could be applied across the programming electrodes to alter the distribution of the dopants, thereby directing or combining current paths on the fly.

Figure 6A:
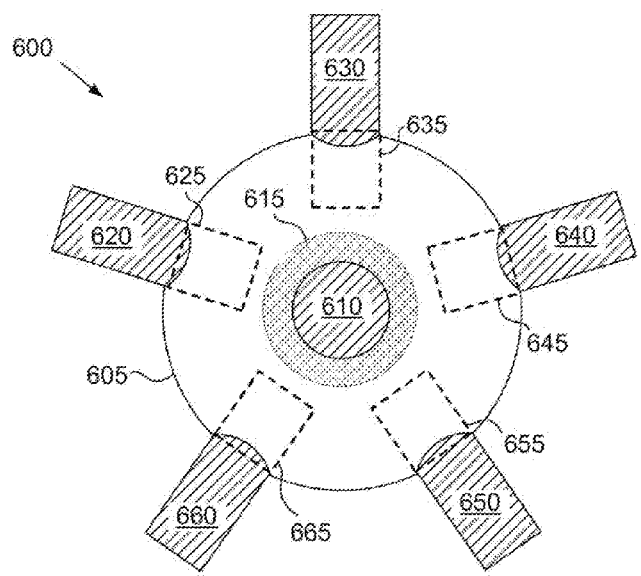
FIGS. 6A-6E are diagrams of illustrative a multi-terminal rotary switch and a routing structure made up of multi-terminal rotary switches, according to one embodiment of principles described herein.
Figure 6B:
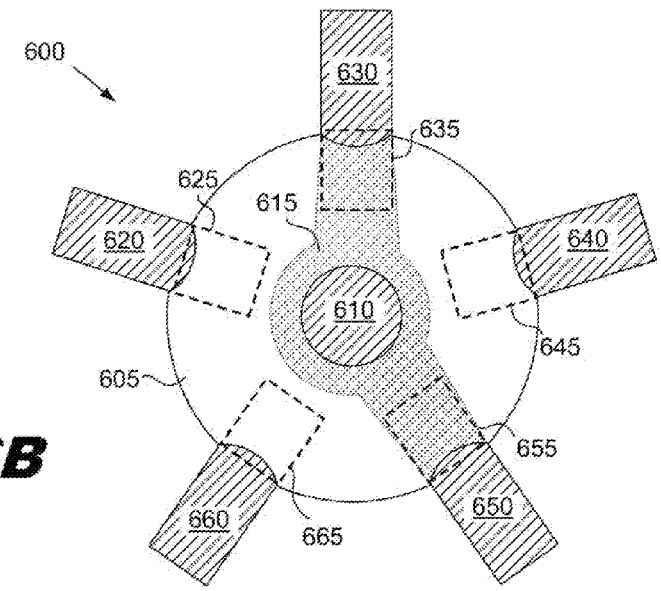

FIGS. 6A and 6B show an illustrative embodiment of a rotary switch (600) with five signal electrodes (620, 630, 640, 650, and 660). The five signal electrodes are spaced around the perimeter of a memristive matrix (605) and are in electrical contact with the memristive matrix (605). Immediately in front of each of the signal electrodes, a programming electrode (625, 635, 645, 655, and 665) is positioned above or below the memristive matrix (605). The programming electrodes are shown as dashed boxes to prevent the obscuration of structures and regions beneath the programming electrodes. The programming electrodes (625, 635, 645, 655, and 665) are not in direct electrical contact with the memristive matrix (605), but are permanently separated from it by a thin insulating layer.

FIG. 6A shows the rotary switch (600) in an "OFF" state, where the each of the five signal electrodes (620, 630, 640, 650, and 660) are electrically isolated. A central programming electrode (610) has drawn the dopants within the memristive matrix (605) to the center of the memristive matrix (605). The dopants cluster around the central programming electrode (610) in a toroidal region (615). This clustering of the dopants could be accomplished using an electrical field created by applying voltage bias across the programming electrodes and central programming electrode (610). As discussed above, a variety of positive or negative dopants could be used within a memristive matrix. The direction, intensity, and duration of the applied electrical field could be tailored to the specific memristive material and dopant species.

FIG. 6B illustrates the programming of the rotary switch (600) to connect two specific electrodes (630, 650). To program the rotary switch (600), the programming electrodes (635, 655) above the selected signal electrodes (630, 650) are energized to draw a portion of the dopants toward the signal electrodes (630, 650). This creates a conductive conduit from the signal electrodes (630, 650) to the central toriod (610). The signal or current can then pass through the conductive conduit, around the toroid and down a second conductive conduit to the destination signal electrode.

Figure 6C:
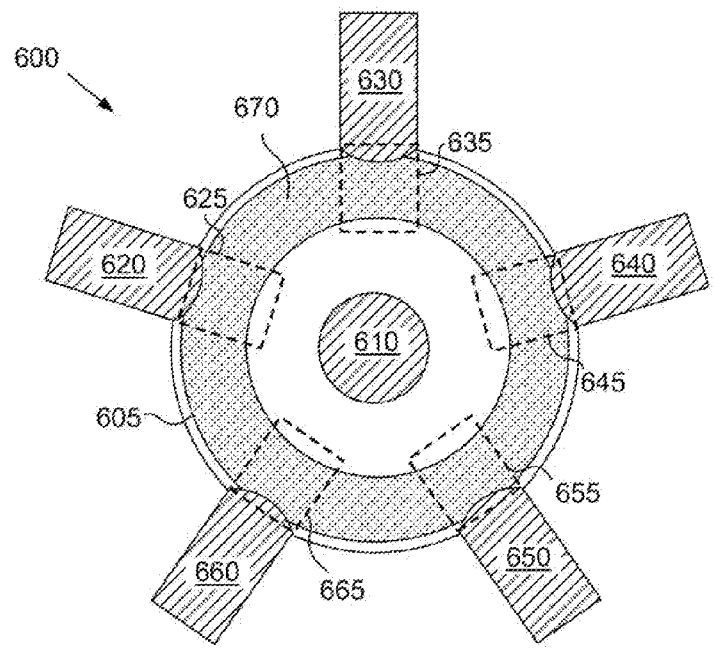

FIG. 6C shows the rotary switch (600) in an "ALL ON" configuration in which the dopants are driven to the outer perimeter of the memristive matrix (605). In the "ALL ON" configuration, the high dopant concentration around the perimeter of the memristive matrix (605) forms a conductive pathway (670) that connects all of the signal electrodes. The "ALL ON" configuration could be achieved by a variety of methods that create a suitable electrical field between the central electrode (610) and the perimeter programming electrodes (625, 635, 645, 655, and 665). For example, a large voltage could be applied to the central electrode (610) and the programming electrodes could be grounded. Alternatively, the programming electrodes could have a large voltage of opposite polarity applied and the central electrode (610) could be grounded.

Figure 6D:
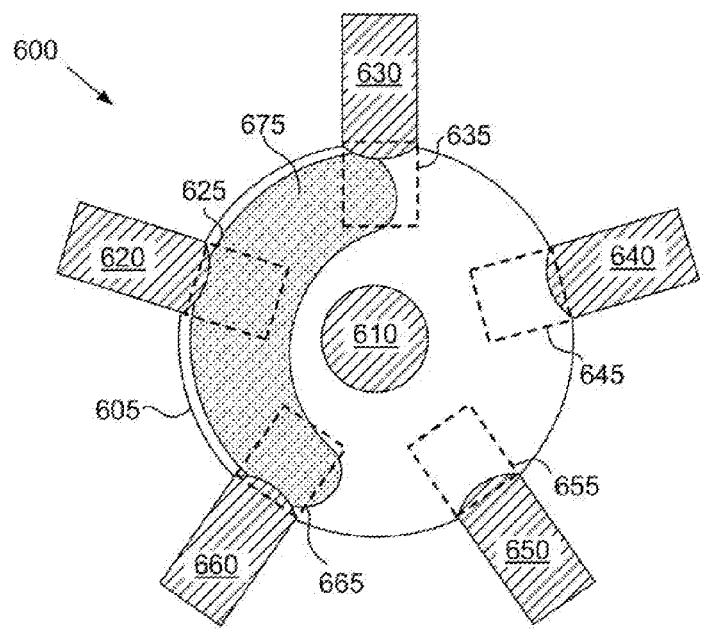

FIG. 6D shows a rotary switch (600) in which a highly doped region (675) connects three signal electrodes (620, 630, 660). This configuration could be achieved by applying a first voltage to the central electrode (610) and the remaining program electrodes (655, 645). The balance of the programming electrodes (625, 635, 665) could be at an opposite polarity, grounded, or at a lower voltage of the same polarity. The electrical field generated between the first group of programming electrodes (610, 645, 655) and the second group of programming electrodes (635, 625, 665) is formed such that the dopants are driven into a region which connects the desired signal electrodes (620, 630, 660).

As discussed above, the doped regions can be dynamically reconfigured to alter the conductive region(s) to modulate, redirect, multiplex, de-multiplex, or disconnect current flows. Additionally, once the programming voltage is removed from the programming voltage the conductive regions remain stable over long time periods. This allows for "set and forget" configuration of the device. The five signal electrodes (620, 630, 640, 650, 660) are merely illustrative of the number of electrodes that could be used within the device.

Figure 6E:
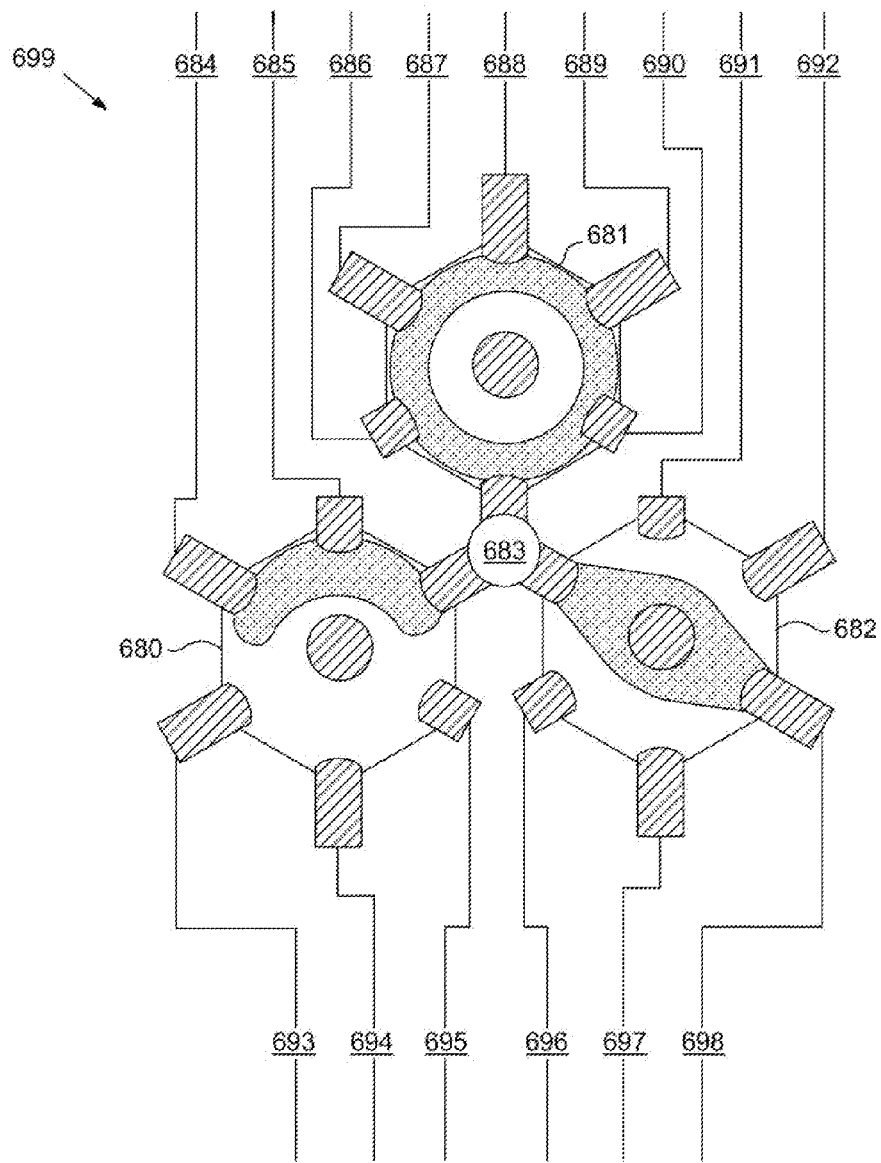

FIG. 6E shows a switching configuration (699) in which three rotary switches (680, 681, 682), each with six signal electrodes, share a common electrode (683). The switching configuration (699) allows for any combination of the 15 signal lines to be switched to any other signal line. Further, any of number of the 15 lines (684 through 698) can be multiplexed or de-multiplexed to the central electrode (683) or other perimeter electrode. In the example shown in FIG. 6E, a number of lines (684-690, 698) are electrically connected to the central electrode (683). The configuration illustrated in FIG. 6E would allow for current flow between the connected electrodes, multiplexing, or de-multiplexing.

Figure 7:
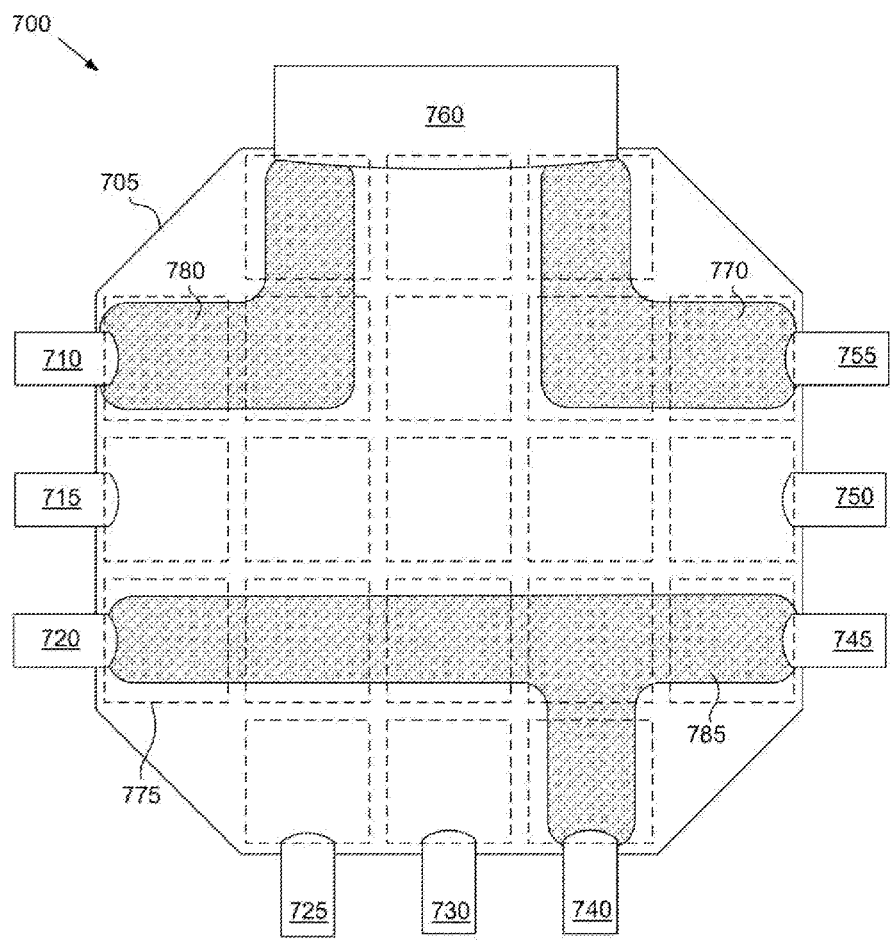
FIG. 7 is a diagram of an illustrative multi-terminal routing structure, according to one embodiment of principles described herein.

FIG. 7 shows a memristive switch array (700) which is configured to act as a multiplexer/de-multiplexer. The memristive switch array (700) includes a memristive matrix (705) which contains a number of dopants which are mobile under the influence of an electrical field. A number of signal electrodes (710-760) are placed around the perimeter of the memristive matrix (705) and are in electrical contact with the memristive matrix (705). An array of programming electrodes (775) overlay the memristive matrix (705). The programming electrodes insulated from the memristive matrix (705). According to one illustrative embodiment, the programming electrodes (775) have corresponding programming electrodes underneath the memristive matrix (705). In an alternative embodiment, a ground plane underlies the memristive matrix (705).

As previously described, programming electrodes can be selectively activated create electrical fields which repel or attract dopants. By selectively activating electrodes within the programming electrode array (755), conductive channels (770, 780, 785) can be formed which connect various electrodes. In addition to simple connections between the various signal electrodes, the memristive switch (700) could be used for more complex operations. For example, in a multiplexer operation, one or more signal electrodes (710, 755) may be connected by a separate conduction paths (770, 780) to a single signal electrode (760) which outputs the combined signals. Similarly, a multiplexing operation may be performed by creating a branching conduction path (785). In the example shown in FIG. 7, the electrical signals carried by two signal electrodes (740, 745) are passed to a third signal electrode (720). For de-multiplexing operations, similar principles can be applied. For example, an incoming signal could be routed from a single electrode (760) into two or more paths (770, 780).

According to one illustrative embodiment, the switching time between various configurations is not limited by the overall size of the memristive matrix. There is no requirement that the dopants travel across the entire length or width of the memristive matrix. Rather, the dopants need only be moved a few nanometers from beneath one programming electrode to another programming electrode. For example, to disconnect all of the signal electrodes, the high dopant concentrations in front of each of the connected electrodes need only be diffused toward the center of the memristive matrix (705) about one-half of the width of a programming electrode. To connect a new electrode (725) to the branched conductive path (785), the dopants need only be moved a short distance to be in contact with the new electrode (725). Any number of the programming electrodes could be activated at the same time, resulting in a rapid reconfiguration of the memristive switch array (700).

As discussed above, after the dopants have been moved to a new location by the relatively high programming voltage, the dopants remain in place over long periods of time. Typically, the signal voltages will not be sufficient to significantly influence the position of the conductive channels. For example, the programming voltages may be on the order of 10 volts, while the signal voltage may be on the order of 1 volt. Additionally, in the illustrative configuration shown in FIG. 7, the signal voltages produce relatively low intensity electrical field gradients because the voltage differences between two electrodes connected by a conductive channel low and the electrodes are separated by a relatively large distance. In contrast, the programming electrodes act over very small distances (i.e. the distance from one programming electrode to another or the underlying ground plane), creating a large local electrical gradient.

Unlike many conventional switching devices, the illustrated memristor switching devices (200, 500, 505, 510, 600, 699, 700) are not an "all or nothing" device. The memristor switching devices (200, 500, 505, 510, 600, 699, 700) can vary the resistance of the conductive paths in an analog manner by increasing or decreasing the concentration of dopants in the conductor path.

Memristive devices can be used in a variety of situations to tune various components in an integrated circuit or system. In one illustrative application, it may be desirable to change the operating characteristics of some circuits to match a particular signal input for making various measurements. For example, many transducers or measurement systems perform best when there is a "bridge circuit", in which the resistance of a variable resistor is tuned in order to balance a differential circuit to make a very precise measurement. One example is measuring a precise voltage difference for a thermocouple, but there are many other examples of bridge circuits used for measurements.

Additionally, it can be important for a number of cooperating circuits to have compatible characteristics. If the characteristics of various circuits are not compatible, the system performance could be compromised. In one embodiment, a memristive device can be used as a trimming resistor to adjust the impedance of a circuit. For example, the memristive device can be used to match the output impedance of a source circuit with the input impedance of a load circuit to maximize the power transfer and minimize reflections from the load. In other cases where signal transfer is important, impedance bridging techniques can be used to maximize the transfer of a voltage signal to the receiving device.

There is a certain amount of variability in all electronic circuits, which means that circuits that are fabricated will have slightly different operating parameters, in terms of their speed of operation and the delay time for signals to propagate through the circuit. In the past, this problem was handled by installing mechanically adjustable "trim pots" in circuit boards. An expert engineer was required to test and tune up a circuit in order to optimize its properties—this was done by examining the electronic signal at various test points on a circuit board using an oscilloscope, and then using a screw driver to adjust the trim pot to change the resistance of the variable resistor to bring the impedance of the circuit up to its optimal performance. This was required when first testing a circuit to ensure that it worked properly, and with time, various elements in a circuit could change, so an expert technician was required to retest and retune a circuit in the field. As circuits became more integrated, this requirement for tuning became less necessary, as the reproducibility of integrated circuit components improved. Also, there is no place on an integrated circuit to place a trim pot, so for the most part, integrated circuits cannot be tuned. As feature sizes are getting smaller, the variability of component properties is necessarily increasing, just because a single atom determines the lower limit of the uncertainty in a feature size. Thus, future generations of circuits will need to have trim pots to be able to tune and optimize the circuits. In fact, as device variability gets larger, it will be likely that circuits will not work at all if they cannot be tuned. Consequently, it is becoming increasingly important to have flexible, reliable, and effective method of tuning modern electrical circuits.

Memristive devices could be used in combination with various feedback circuits to initially tune an integrated circuit and to continually optimize the performance of a circuit during operation. Thus, the performance of the circuit can be continually improved with such memristive devices and feedback elements. As certain components in the circuit failed, the circuit would use the memristive devices to reconfigure and re-optimize itself. Thus, such circuits should have the ability to degrade gracefully with age, rather than die a sudden death when a single component failed.

Figure 8A:
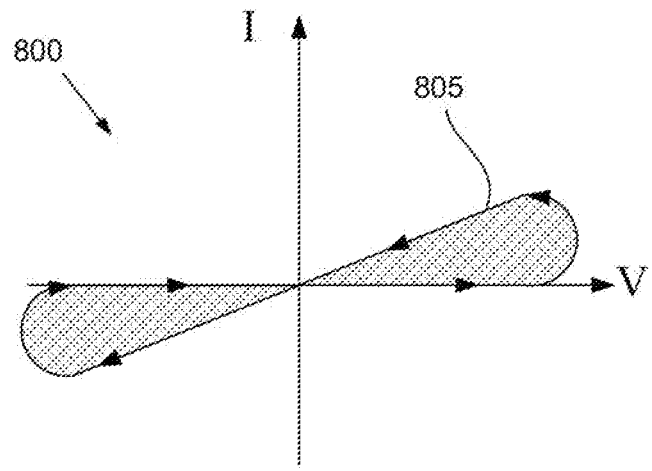
FIGS. 8A-8B show illustrative graphs of circuit characteristics which can be tuned using a memristive device, according to one embodiment of principles described herein.
Figure 8B:
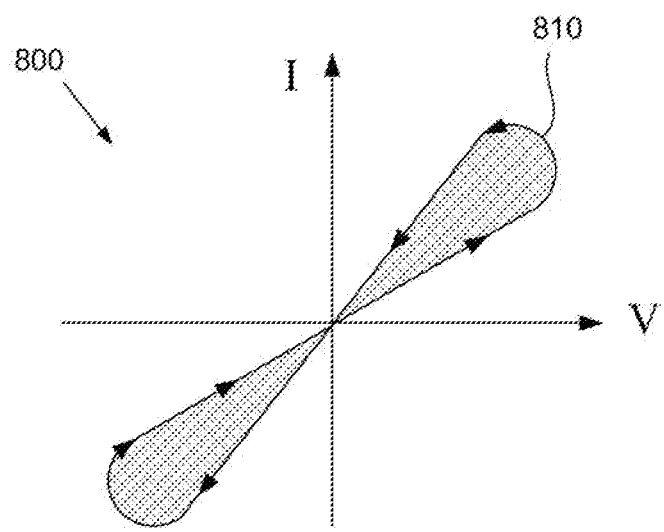

FIGS. 8A and 8B are illustrative hysteresis loops which may be present within an electrical circuit. The hysteresis loops are used as illustrative characteristics within a circuit which can be tuned using memristive devices. Memristive devices may allow adjustment of a variety of electrical characteristics, including resistance, capacitance, inductance, or more complex characteristics. The illustrative hysteresis graph shown in FIG. 8A is one method of describing one or more performance characteristics of an electrical circuit. The vertical axis of the graph represents the variations in the impedance of a circuit or electrical element. Impedance of a circuit describes the measure of opposition to a voltage. The impedance of a circuit is influenced by a variety of factors, including capacitance, resistance, and inductance of various components which make up the system. The horizontal axis of the graph (800) represents the variation of the voltage. From the origin of the graph, higher positive voltages are shown to the right and more negative voltages are shown to the left.

As can be seen from the hysteresis loop (805), the impedance of the circuit is path dependent and is influenced not only by the currently applied voltage but on the past applied voltage. FIG. 8B is an illustrative graph showing a rotation in the hysteresis loop (805) about the origin. This rotation of the hysteresis loop could be an example of a second device with a different hysteresis curve, a time dependent change within a circuit which alters the initial hysteresis curve shown in FIG. 8A, or an intentional adjustment to the initial hysteresis curve of FIG. 8A to tune it to other circuits.

FIG. 9 is a diagram of an illustrative memristive device (900) which is configured to fine tune the resistivity of a hysteresis loop. According to one illustrative embodiment, the memristive device (900) includes a memristive matrix (905) which has a cross shaped geometry. At the end of each of the cross arms, an electrode (915, 920, 925, 930) is in electrical and physical contact with the memristive device (900). In this embodiment, the bottom and top electrodes (920, 930) are connected to a circuit (935) and/or a measurement device (940) which measures the current/voltage curve of the system. The right and left electrodes (915, 925) can be used to program the transmemristor (900). One or more species of dopant or ions (910, 912, 914) are initially held within the one or more of the arms of the memristive matrix (905). These dopants or ions may be one or more of the species discussed previously or any other suitable species.

Figure 9A:
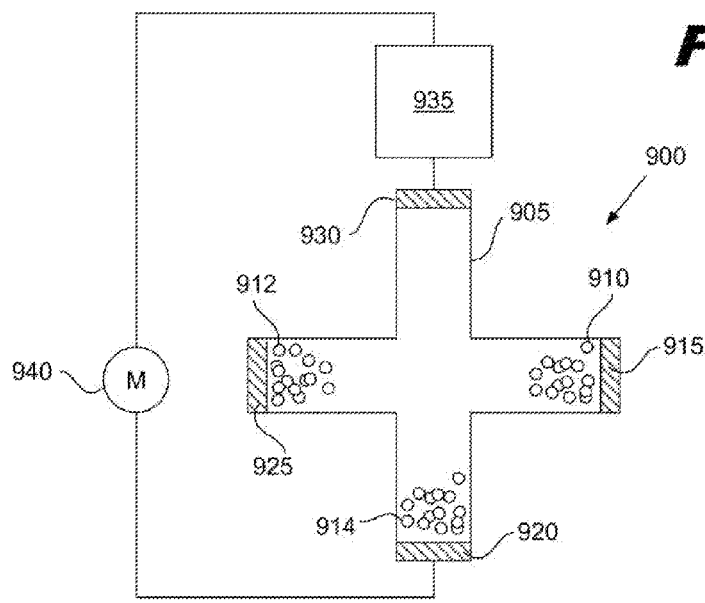
FIGS. 9A-9C are diagrams of an illustrative memristive device configured to tune circuit characteristics, according to one embodiment of principles described herein.
Figure 9B:
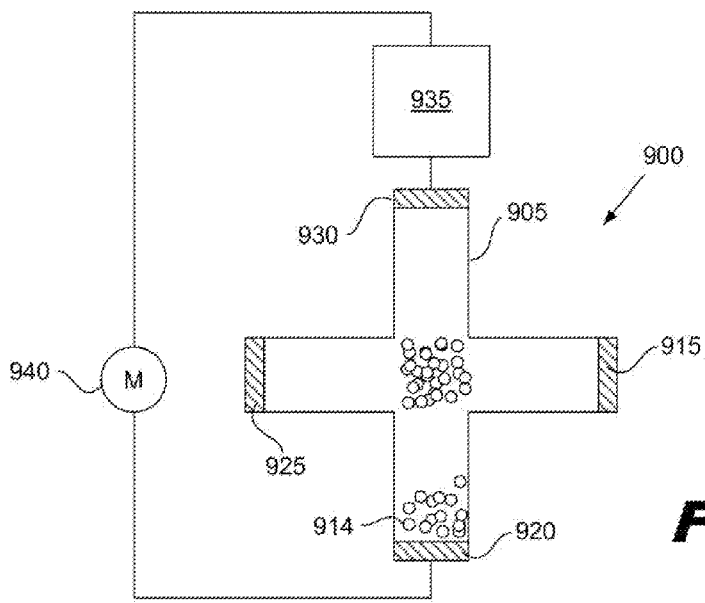
Figure 9C:
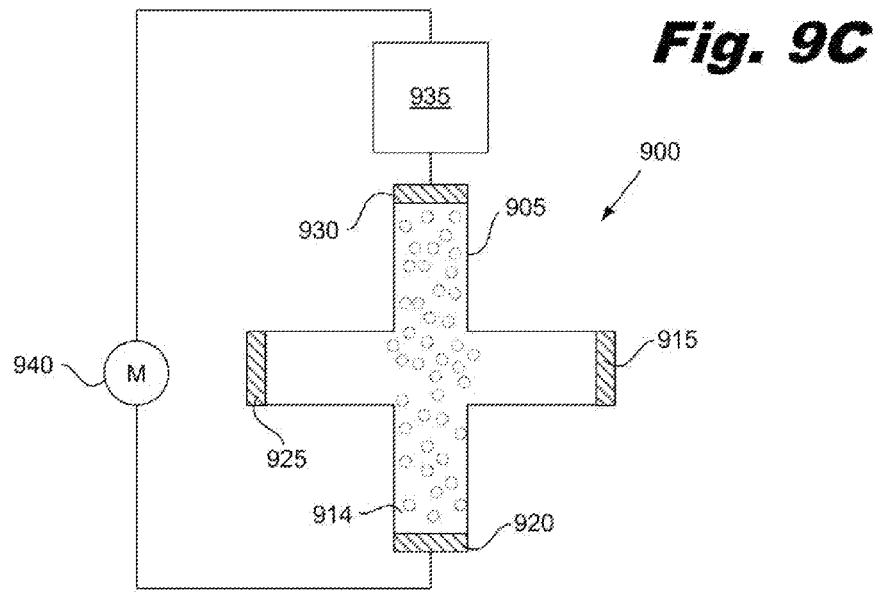

In circumstances where an even lower resistance is desired, the dopants could first be pushed into the cross portion of the memristive matrix and then drawn into at least one of the top and bottom arms as shown by FIG. 9C. This could be accomplished by applying a voltage bias across the top and bottom electrodes such that the dopants were repelled from the bottom electrode (920) and drawn toward the top electrode (930). This could result in a relativity uniform distribution of dopants throughout the top arm, intersection, and bottom arm. The resistance could be increased by repelling the dopants from the top and bottom electrodes and drawing them toward the programming electrodes (915, 925).

Figure 10:
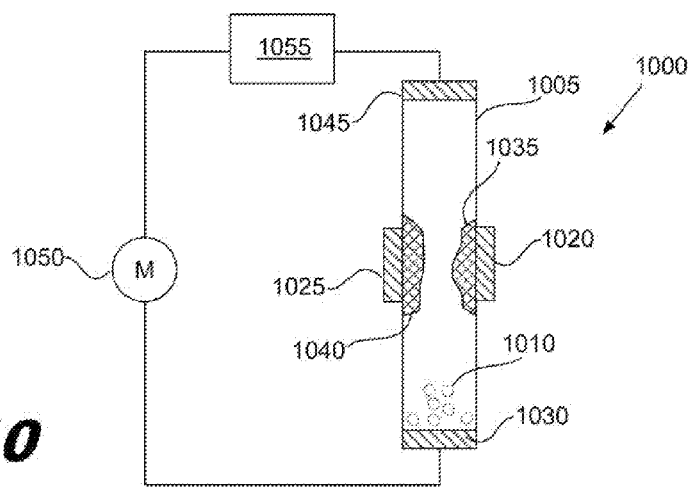
FIG. 10 is a diagram of an illustrative memristive device configured to tune circuit characteristics, according to one embodiment of principles described herein.

The memristive device illustrated in FIGS. 9A-9C is only one illustrative embodiment of a memristive device which could be used as a variable resistor. FIG. 10 shows an alternative embodiment of a memristive device (1000) which alters depletion regions (1035, 1040) to reduce or increase the cross-section of the conduction path through the memristive matrix (1005). According to one illustrative embodiment, the memristive device (1000) includes two programming electrodes (1020, 1025) and two signal electrodes (1030, 1045). The two programming electrodes (1020, 1025) contact the memristive matrix (1005) across its width and the two signal electrodes (1030, 1045) contact the memristive matrix (1005) at either end. According to one illustrative embodiment, the memristive matrix (1005) may contain sufficient dopants throughout its volume to make it a weak conductor. A number of excess dopants (1010) may also be present. A measuring device (1050) is connected to the signal electrodes. The measuring device (1050) is used to measure the resistance of the memristive device (1000) or other target characteristic of a circuit (1055).

The memristor device (1000) can be programmed to alter its resistance in at least two ways. First, the programming electrodes (1020, 1025) can be used to displace the dopants that are immediately in front of them to create depleted regions (1035, 1040). This narrows the cross-section of the conductive matrix (1005) and increases the overall resistance of the memristive device (1000). Using this method the resistance may be varied from the nominal resistance of the matrix (1005) when the depleted regions (1035, 1040) are absent to a very large resistance which corresponds to a complete depletion of the area between the programming electrodes (1020, 1020). Additionally or alternatively, a second method could be used which moves excess dopants (1010) through matrix (1005) to alter the electrical properties of the memristive device (1000).

Figure 11A:
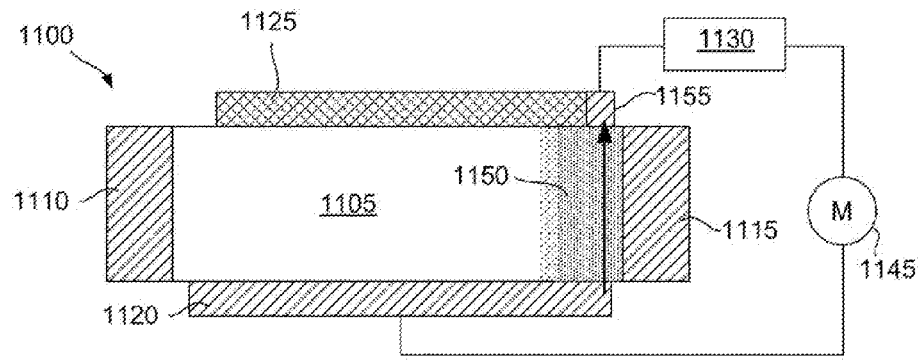
FIGS. 11A-11C are diagrams of an illustrative memristive device configured to tune circuit characteristics, according to one embodiment of principles described herein.
Figure 11B:
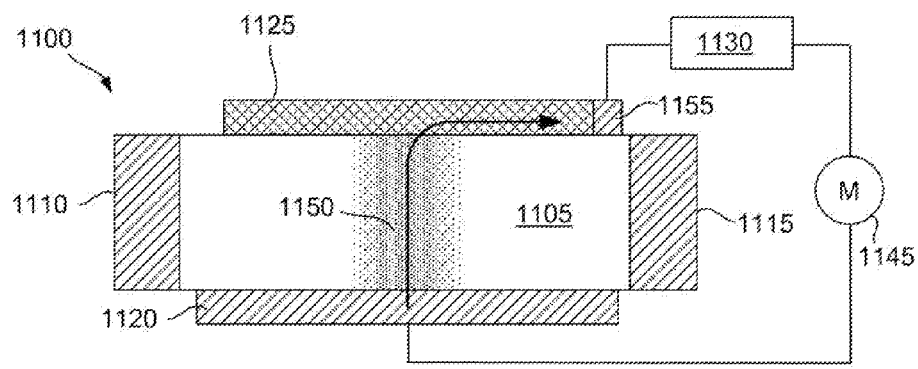
Figure 11C:
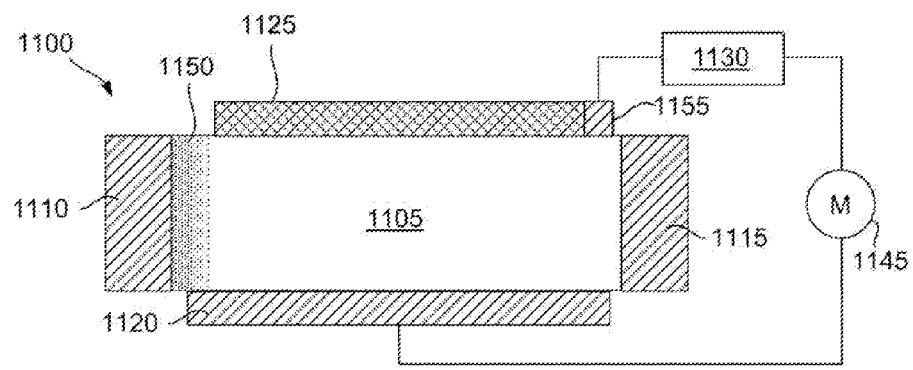

FIGS. 11A through 11C illustrate a memristive device (1100) which can be utilized as an infinitely variable resistor. According to one illustrative embodiment, the memristive device (1100) is comprised of an elongated memristive matrix (1105) which has a left programming electrode (1110) and a right programming electrode (1115). The programming electrodes may be in direct electrical contact with the memristive matrix (1105) or electrically insulated from the matrix (1105). A contact electrode (1120) is in electrical contact with the matrix (1105) across the bottom of the matrix (1105). On the opposite side, a resistive electrode (1125) is in contact with a portion of the matrix (1105) but does not extend along the entire length of the matrix (1105). The resistive electrode (1125) is connected to a signal lead on the right side by at a conductive terminal (1155) which is also in electrical contact with the matrix (1105).

FIG. 11A shows a dopant band (1150) within the memristive matrix (1105). As discussed above, the dopant band (1150) creates a conductive pathway between electrodes it contacts. In this case, a conductive pathway is created directly between the contact electrode (1120) and the conductive terminal (1155). Because electrical current (shown by the dark arrow) can flow from the contact electrode (1120) directly across the conductive pathway to the conductive terminal (1155), the memristive device (1100) exhibits a very low resistance.

FIG. 11B shows the memristive device (1100) in an intermediate resistance configuration. In this configuration, the programming electrodes have moved the conductive band (1150) into the center of the matrix (1105). The current flow (shown by the dark arrow) must now flow from the contact electrode (1120), across the conductive band, into the resistive electrode and along its length to reach the conductive terminal (1155). The increase in resistance is directly proportional to the distance current flows through the resistive electrode (1125). The dopant band (1150) can be moved to any location along the resistive electrode (1125) resulting in an infinite range of resistances.

FIG. 11C shows the memristive device (1100) in a very high resistance configuration. In this configuration, the dopant band (1150) has been moved to the extreme left of the memristive matrix (1105). The resistive electrode (1125) does not extend to the extreme left of the matrix (1105). Consequently, there the dopant band (1150) does not create a conductive pathway to the resistive contact (1125). This results in a very high resistance or open circuit configuration.

The embodiment shown in FIGS. 11A-11C is only one illustrative embodiment of a memristive device which can be configured to supply an infinite range of resistances. In an alternative embodiment, the contact electrode (1120) may also be made from a resistive material. Additionally or alternatively, the resistive contacts may have varying thicknesses. For example, the resistive contact (1125) may have a triangular cross-section, with the thicker base located to the right and in direct contact with the conductive terminal (1155). The apex of the triangle could be to the left, resulting in a decreasing conductive cross-section of the resistive element (1125) as the dopant band moves to the left. Further, the thinning of the resistive electrode (1125) at the apex could provide a smoother transition to the non-conductive state illustrated in FIG. 11C.

Figure 12:
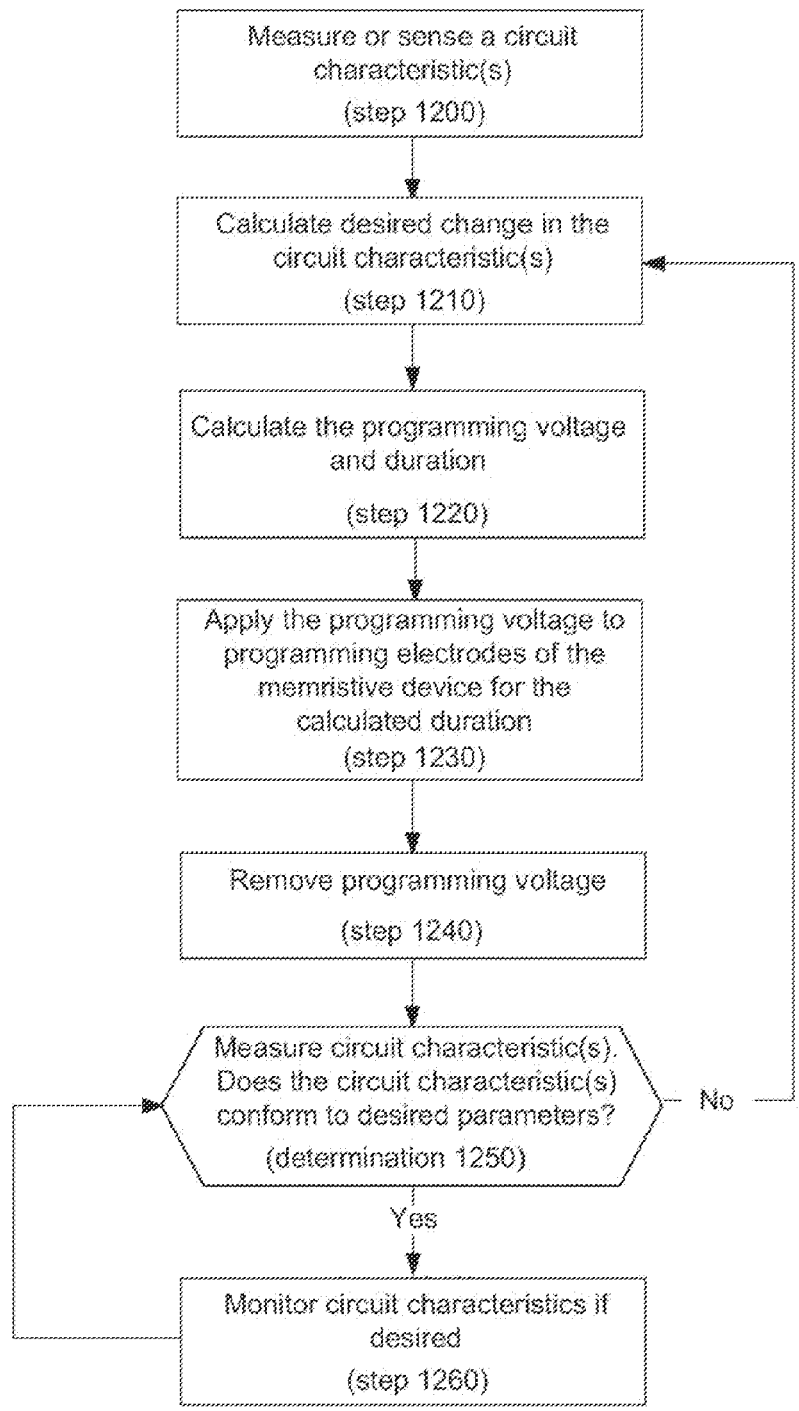
FIG. 12 is a flowchart of an illustrative method for tuning circuit characteristics using a memristive device, according to one embodiment of principles described herein.

FIG. 12 is a flow chart which shows one illustrative method for using a memristive device to tune one or more characteristics of a circuit. To tune a characteristic of a circuit or component, measurement is made of the target characteristic using the measuring device or other sensing means (step 1200). For example, a measuring device may be used to directly measure the target characteristic. By way of example and not limitation, the measuring device may be a voltmeter, ammeter, or other specially designed circuit. Additionally or alternatively, the performance of the circuit itself could be used to indirectly sense the target characteristic.

The desired change is calculated and the appropriate change in location of dopants within the memristive device is determined (step 1210). The magnitude and duration of a programming voltage which will produce the desired change in the location of dopants is then calculated (step 1220). This programming voltage is applied to one or more of the programming electrodes. The programming voltage creates an electrical field which drives the at least a portion of the dopants to a new location within the memristive matrix (step 1230). The programming voltage is then removed (step 1240). As discussed above, the resistance of the memristive matrix changes according to the location and concentration of the dopants. Areas of the memristive matrix with higher concentrations of dopants exhibit lower electrical resistance. This change in resistance could be used to fine tune the electrical characteristics of the circuit. As mentioned above, the locations of the dopants within the memristive matrix can be stable over long time periods, even when subjected lower voltage biases and current conduction. Consequently, the adjustment of a memristive device can result in a stable but adjustable change to the characteristics of the circuit.

A measurement could again be taken using the measuring device. If the measurement indicated that desired change in the measured characteristic was not achieved, the process could be repeated (determination 1250).

If the desired change in the measured characteristic was accomplished, no further action would be required. Periodic monitoring of the characteristic could be performed to ensure the long term stability of the characteristic (step 1260). If significant deviations of the characteristics were observed, the resistance of the transmemristor could again be changed.

The ability for a memristive device to rapidly switch from a conducting state to a non-conducting state can be desirable in many switching and routing applications. Because the switching action of a memristive device is based on motion of dopants through a matrix, there is an inherent delay as the dopants move into the desired position. This inherent delay can be dependent on a variety of factors. For example the delay may be influenced by the type of matrix material, temperature of the matrix, the dopant species, the applied programming voltage, and the distance the dopants must travel to reconfigure the memristive device. In some devices, the physical geometry of the device can be designed to allow for rapid switching operation.

Figure 13A:
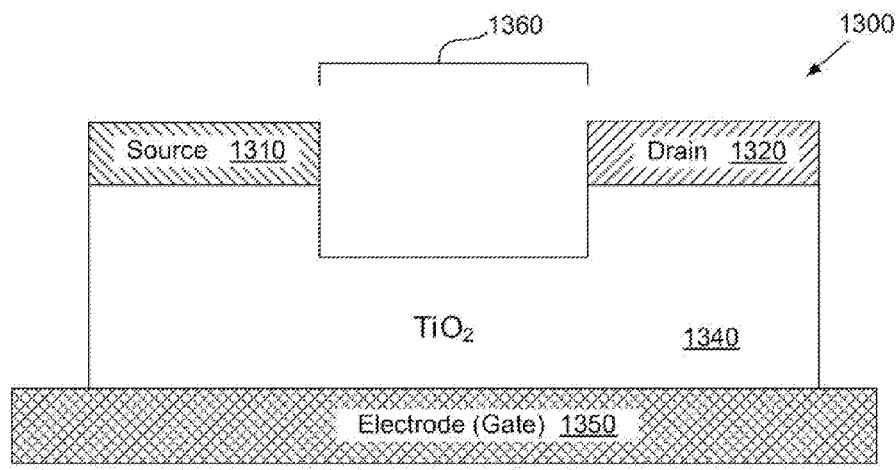
FIGS. 13A-13B are diagrams of a fast switching memristive device, according to one embodiment of principles described herein.

FIG. 13A is a diagram of a fast switching memristive device (1300). According to one illustrative embodiment, the memristive device (1300) is a three terminal oxide device which consists of a titanium oxide ($TiO_2$) matrix (1340) and 3 electrodes. A "source" electrode (1310) and a "drain" electrode (1320) contact either end of a length of the top surface of the titanium oxide matrix (1340). The "source" electrode (1310) is the electrode from which the electrical energy is introduced into the memristive or other device and the "drain" electrode (1320) is the electrode from which the electrical energy exits the device. Because the conduction between the two electrodes (1310, 1320) is not generally direction specific and the geometry is symmetric in that dimension, the designation of a one particular electrode as a "source" and the other as a "drain" is an arbitrary designation applied for convenience of explanation. An insulating channel (1360) is formed between the source and drain electrodes (1310, 1320) such that there is no straight-line path between the top two contacts within the titanium dioxide matrix (1340). A third "gate" electrode (1350) is in contact with the bottom of the memristive matrix (1340) and spans the entire lateral areas under the two top electrodes (1310, 1320).

Figure 13B:
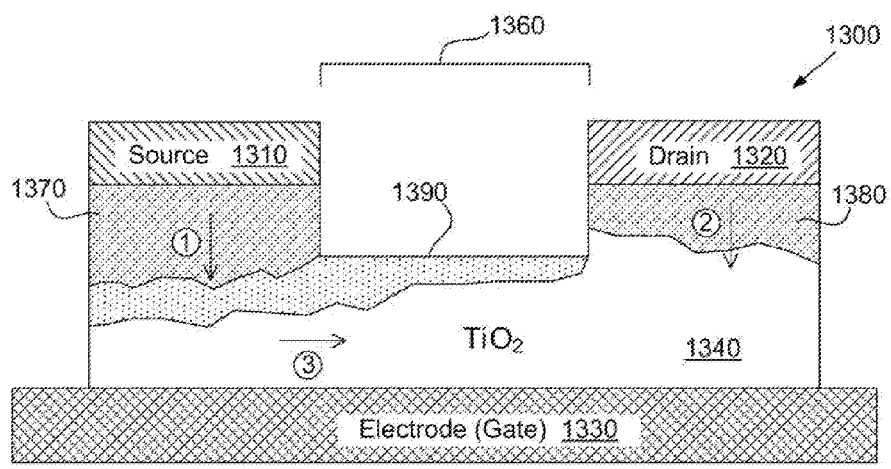

Beginning with this basic structure, portions of the intrinsic titanium dioxide matrix (1340) are transformed into conducting regions by applying a programming voltage across two or more of the electrodes to move concentrations of dopants through the matrix (1340). According to one illustrative embodiment shown in FIG. 13B, programming voltages are applied in the following sequence to initially configure the switching device: First, a programming voltage of the proper polarity is applied between source electrode (1310) and gate electrode (1330). This extends a first conductive region (1370) by drawing the dopants down toward the gate electrode (1330) as shown by the arrow labeled "1". This first conductive region (1370) may extend below the bottom of the channel, but does not extend to the gate electrode (1330). Second, a programming voltage is applied between the drain electrode (1320) and the gate electrode (1330) to form a second conductive region (1380) below the drain which extends down to just above the bottom of the channel (1360) and does not extend to the gate electrode (1330). This action is shown by the arrow labeled "2," Third, a programming voltage is applied across the source and drain electrodes (1310, 1320). This extends one or both of the first and second conductive regions (1370, 1380) underneath the channel (1360) to almost bridge the first and second conductive regions (1370, 1380) as illustrated by the arrow labeled "3". The initial configuration of the memristive device (1300) is now complete and the memristive device (1300) is an "OFF" (nonconductive) state.

The process above assumes that a high concentration of dopants is available at the source and drain electrodes (1310, 1320). This concentration of dopants could be created in a number of ways previously described. Additionally, the first and second steps, in which the dopants are drawn down toward the gate electrode, could be replaced by fabricating the device with an initial layer of intrinsic titanium dioxide and a second layer of doped titanium dioxide with a channel between a first segment and a second segment. The source electrode (1310) could then be formed on the first segment and the drain electrode (1320) could be formed on the second segment. The third step could then be performed to draw dopants underneath the bottom of the channel (1360).

The memristive device (1300) can be rapidly switched to an "ON" state by only a small amplitude/short duration voltage applied between the gate electrode (1330) and the drain electrode (1320). This will move the boundary of second conductive region (1380) down to merge with the third conductive region (1390). Thereby forming a conductive path between the source and drain electrodes (1310, 1320).

Modulating the memristor device (1300) to an "OFF" state is achieved by applying a programming voltage of the opposite polarity between the between gate and drain electrodes (1330, 1320). This causes the second conductive region (1380) to retreat upwards towards the drain electrode (1320), thereby disconnecting the second conductive region (1380) from the third conductive region (1390). This breaks the conductive path between the source and drain electrodes (1310, 1320).

This modulation can occur rapidly because the distance which the dopants must travel to make the final connection/disconnection between the source and drain electrodes is relative short. Further, the gate electrode (1330) remains insulated from the both the conductive regions (1370, 1380, 1390) and the source and drain electrodes (1310, 1320). This decreases the possibility of the memristive device becoming permanently stuck in the "ON" position because of a short circuit between two or more of the electrodes.

The materials and geometry described with respect to the memristive device (1300) are only illustrative. As discussed above, other matrix materials and dopant combinations could be used. For example, one or more dopant species may be present within a single matrix. Additionally or alternatively, a number of different matrix materials could be used in a single device. Further, a variety of geometries and arrays of memristive device could be constructed to suit specific needs.

FIGS. 14A-14E show a number of memristive devices integrated into an illustrative memristive array (1400). In this illustrative embodiment, the memristive array (1400) is comprised of an upper electrode array (1402), a lower electrode array (1404), and a memristive matrix (1425). The electrode arrays (1402, 1404) are segmented into individual electrodes (1407, 1412, 1417, 1437, 1442) by insulating channels (1430, 1432). The insulating channels (1430, 1432) may be made from a variety of materials or may be air gaps. As described above, the insulating channels (1430, 1432) extend into the memristive matrix (1425). The individual electrodes (1407, 1412, 1417, 1437, 1442) are each electrically connected to a lead (1405, 1410, 1415, 1435, 1440). The opposite side of each electrode is electrically and physically connected to the matrix (1425). A number of highly doped regions (1420, 1424, 1422) are present within the matrix (1425).

Figure 14A:
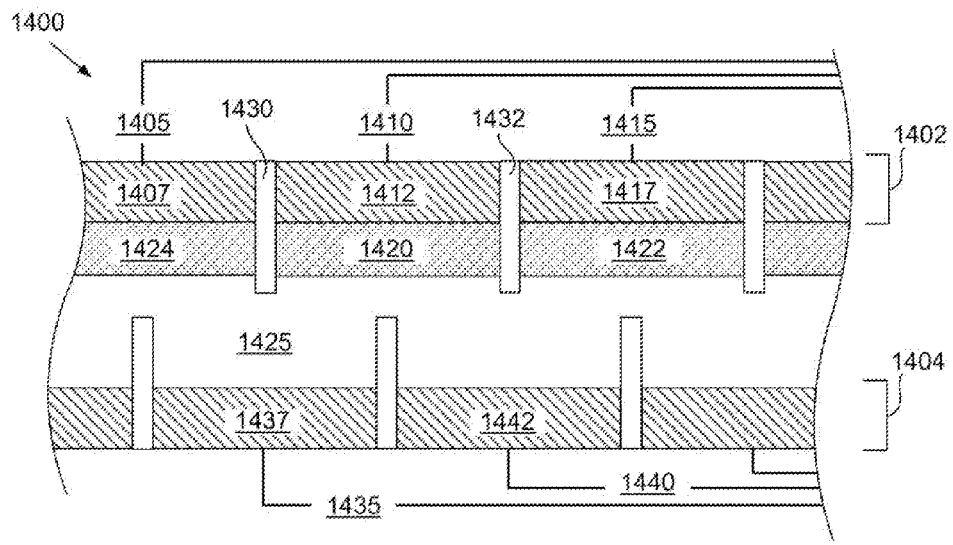
FIGS. 14A-14F are diagrams of a fast switching memristive array, according to one embodiment of principles described herein.
Figure 14B:
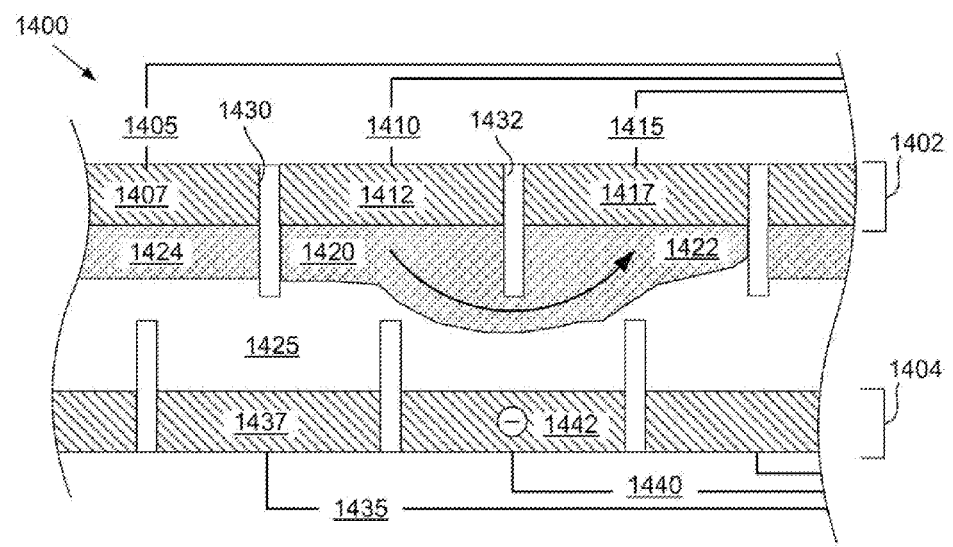

FIG. 14B shows an electrical connection being made between two electrodes (1412, 1417) in the upper electrode array (1402) by the application of a negative programming voltage to an electrode (1442) in the lower array. FIG. 14B assumes that the dopant species is positively charged such that the application of a negative voltage at a bottom electrode (1442) would draw the two conductive regions (1420, 1442) toward the bottom electrode (1442) such that the two conductive regions merge. The merged conductive regions form a conductive path between the two upper electrodes (1412, 1417). As discussed above, the short distances that the dopants have to travel create (or separate) a merged region can produce rapid switching times.

Figure 14C:
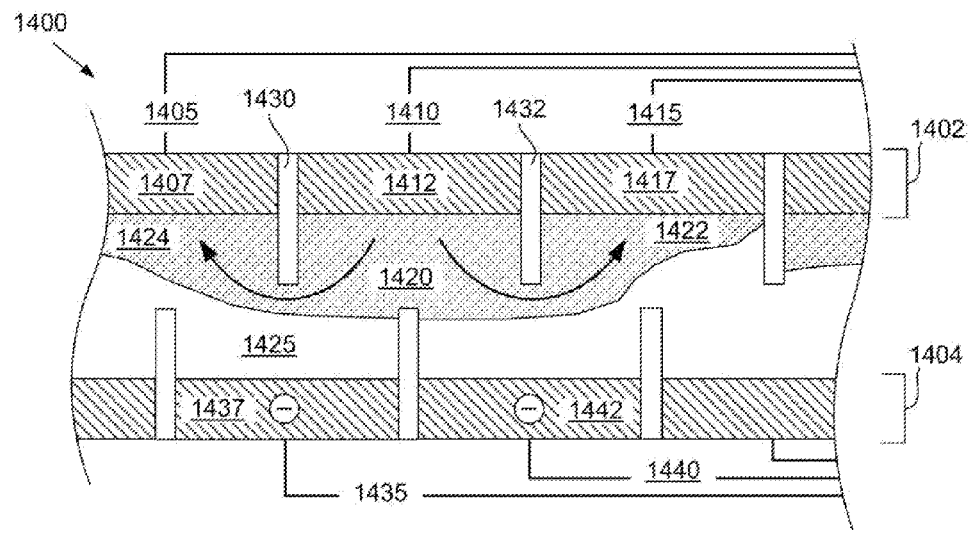

FIG. 14C shows the application of an additional negative programming voltage by a second bottom electrode (1437). This causes another dopant region (1424) to merge with the first two conductive regions (1420, 1422). In the configuration shown in FIG. 14C, three of the electrodes (1407, 1412, 1417) are connected. The arrows illustrating current flow from the center electrode (1412) are merely illustrative. Any connected electrode could serve as a source or a drain electrode. The configuration illustrated in FIG. 14C also shows the potential for the memristive array (1400) to serve as a multiplexer/de-multiplexer.

Figure 14D:
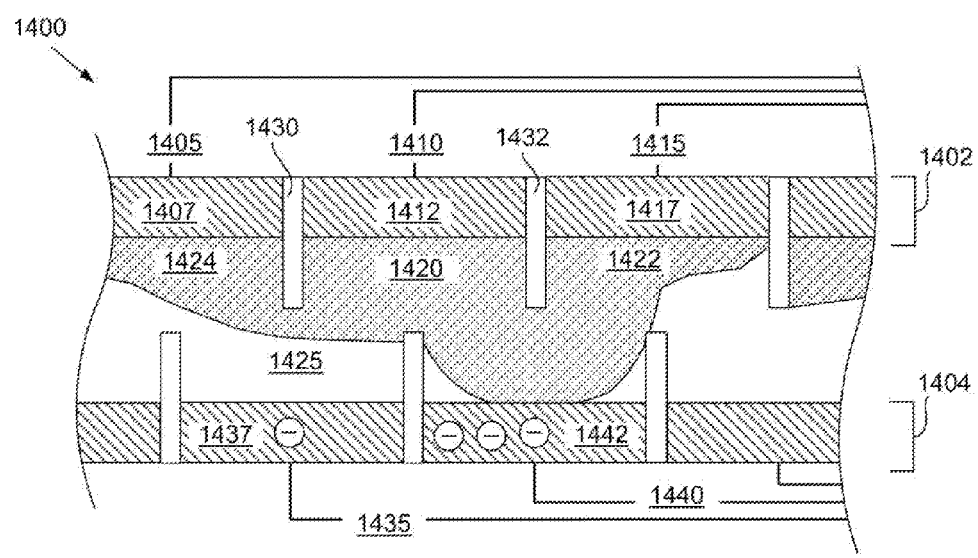

FIG. 14D shows the application of a large negative programming voltage applied to a bottom electrode (1442). This draws the merged conductive region down to contact the bottom electrode (1442). As discussed above, the programming voltage can then be removed and the position and characteristics of the merged conductive region will remain stable over time.

Figure 14E:
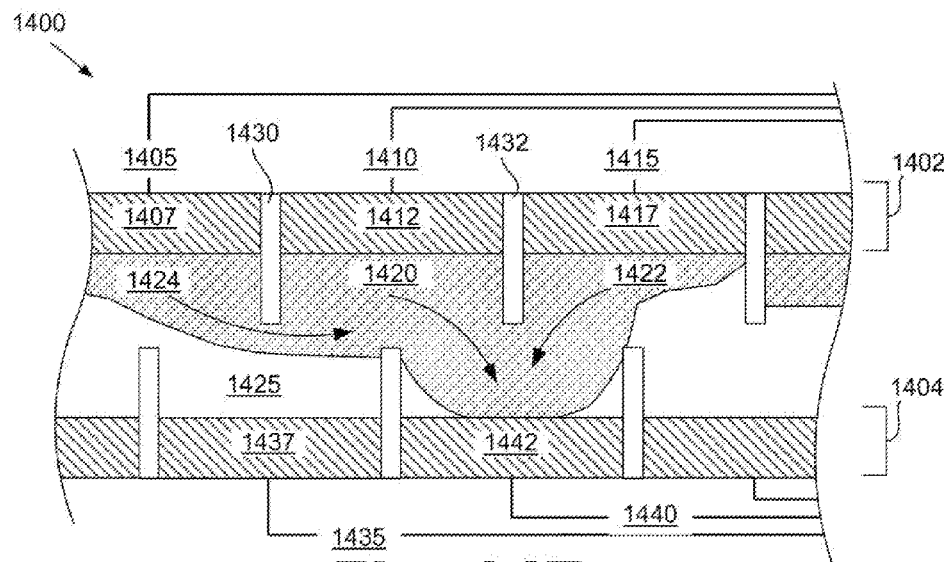

FIG. 14E shows the programming voltage removed from the bottom electrodes (1437, 1442) and current flowing from a number of upper electrodes (1407, 1412, 1417) to the lower electrode (1442).

Figure 14F:
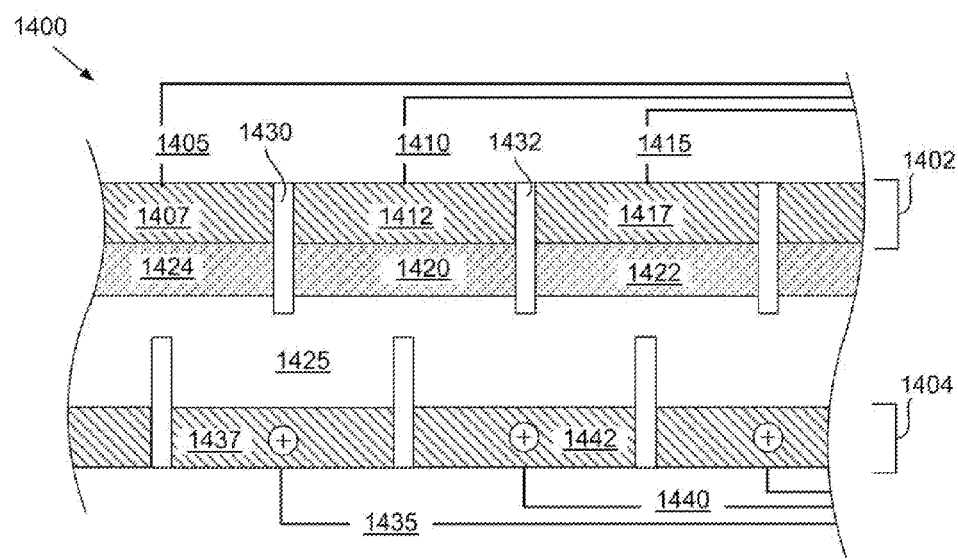

FIG. 14F shows a positive programming voltage applied to the bottom electrode array (1404) which drives the dopants back toward the upper array and disconnects the electrodes. Although the memristive array (1400) is illustrated as a one dimensional array of memristive elements, the memristive array could be extended into two or more physical dimensions.

Figure 15:
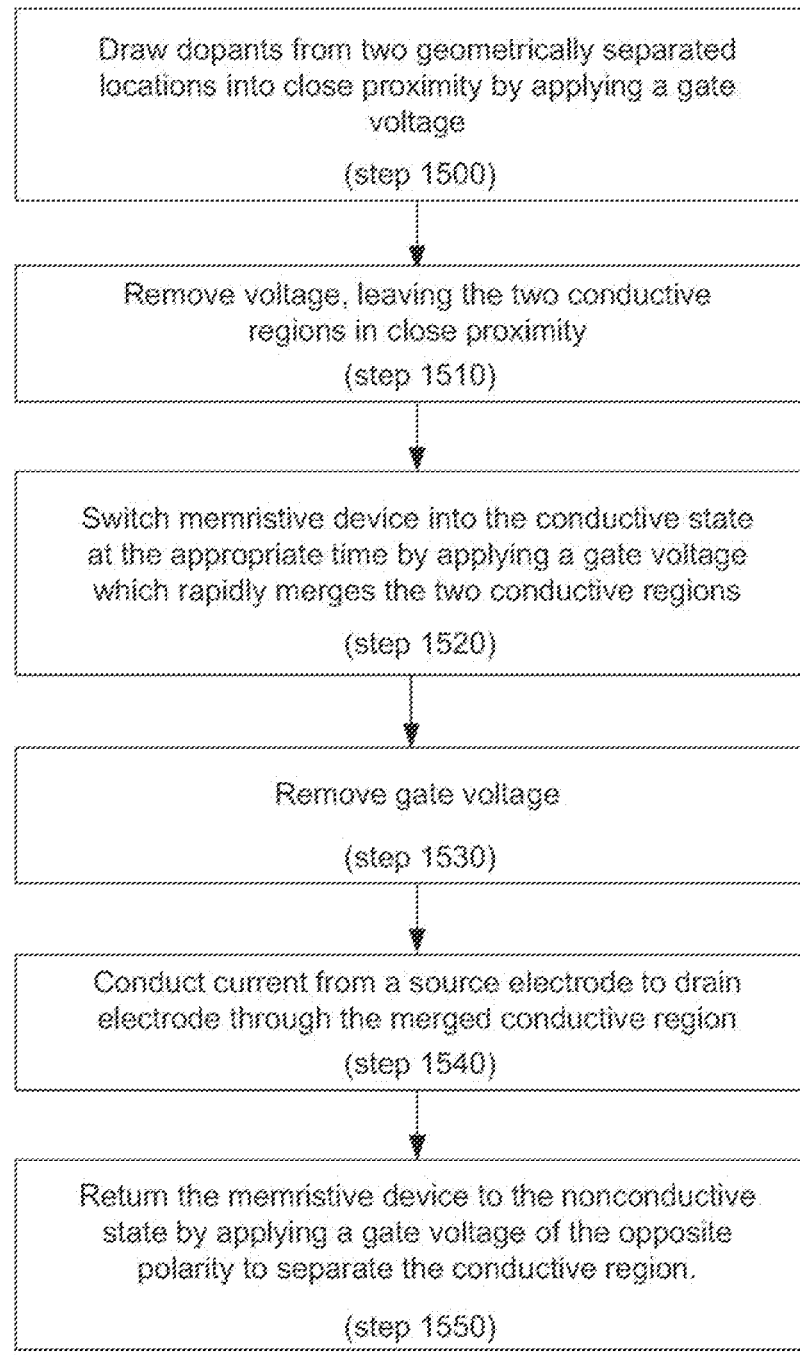
FIG. 15 is a flowchart of an illustrative method for operating a fast switching memristive device, according to one embodiment of principles described herein.

FIG. 15 is a flowchart which shows one illustrative method for rapidly switching a memristive device. In a first step, dopants are draw from two geometrically separated locations into close proximity by applying a programming voltage to a gate electrode (step 1500). As discussed above, the designation of one electrode as a "gate," "source," or "drain" is often arbitrary because a given electrode could be configured to operate in any one of these capacities at a given time. The programming voltage is then removed, leaving the two conductive regions in close proximity (step 1510). In one illustrative embodiment, the doped regions are initially manufactured in close proximity, allowing the first and second steps to be omitted.

The memristive device may then be rapidly switched into the conductive state at the appropriate time by applying a gate voltage which merges the two conductive regions (step 1520). The gate voltage can then be removed (step 1530) and the merged conductive regions remain stable over time. Current may then be conducted from a source electrode to a drain electrode through the merged conductive region (step 1540).

To switch the memristive device to an "OFF" or nonconductive state, a programming voltage of opposite polarity is applied by the gate electrode to separate the conductive regions (step 1550).

In sum, memristor devices can be used in a variety of switching, tuning, and memory applications. In switching applications, various geometries can be used to increase the switching speed and flexibility of memristor devices to direct one or more inputs to the desired outputs. In some embodiments, memristor devices may efficiently be used as multiplexer/de-multiplexers. The analog nature of memristive devices can be leveraged to tune a variety of circuits. These tuning capabilities would allow memristive devices to be used by host circuits to provide self programming, healing, fuzzy logic, and/or neural learning capabilities. Further, the stability of the dopant regions in the absence of programming electrical fields allows the memristor configuration to be maintained over long time periods. This could provide for "set and forget" calibrations. The memristive devices could also be used as memory devices with multiple states. These memory devices could be integrated with various architectures, such as a cross-bar architecture to provide high density data storage, no power requirement for long term data retention, and fast access times.

The preceding description has been presented only to illustrate and describe embodiments and examples of the principles described. This description is not intended to be exhaustive or to limit these principles to any precise form disclosed. Many modifications and variations are possible in light of the above teaching.

What is claimed is:

1. A memristive routing device comprising:
   a memristive matrix;
   mobile dopants, said mobile dopants moving within said memristive matrix in response to programming electrical fields, said mobile dopants remaining stably located within said memristive matrix in absence of said programming electrical fields; and
   at least three electrodes surrounding said memristive matrix, said at least three electrodes being configured to apply said programming electrical fields such that said mobile dopants form conductive paths between at least any two of said at least three electrodes.

2. The memristive routing device of claim 1, wherein a plurality of said memristive matrices are interconnected by said at least one of said at least three electrodes to create a routing array; said routing array being configured to route an electrical signal from any of said at least three electrodes to any other of said at least three electrodes.

3. The memristive routing device of claim 1, wherein said at least three electrodes comprise:
   a plurality of programming electrodes, said programming electrodes being electrically insulated from said memristive matrix and applying said programming electrical fields to said mobile dopants within said memristive device; and
   a plurality of signal electrodes, said signal electrodes being electrically connected to said memristive matrix and being configured to transmit and receive electrical signals via said memristive matrix.

4. The memristive routing device of claim 3, wherein said memristive routing device is configured to create two or more independent conductive pathways between said signal electrodes.

5. The memristive routing device of claim 1, wherein said memristive routing device is configured to act as a multiplexer and de-multiplexer.

6. The memristive routing device of claim 1, wherein at least one said electrodes is surrounded in at least one plane by said memristive matrix.

7. The memristive routing device of claim 1, wherein at least one of said electrodes is separated from a body of said memristive matrix by an insulating layer.

8. The memristive routing device of claim 1, wherein said at least three electrodes are distributed around said memristive matrix to form a rotary switch.

9. The memristive routing device of claim 8, further comprising a plurality of rotary switches connected to form said memristive routing device, each rotary switch comprising at least three electrodes distributed around a memristive matrix.

10. The memristive routing device of claim 1, wherein said memristive matrix is has a cross shape with four arms extending and an electrode located at an end of each of said four arms.

11. A method for tuning electrical circuits with the memristive device of claim 1, said method comprising:
   measuring a circuit characteristic;
   calculating a desired change in said circuit characteristic;
   calculating a programming voltage and duration;
   applying said programming voltage to said memristive device for said duration, said programming voltage creating an electrical field which causes motion of dopants within said memristive device; and
   removing said programming voltage from said memristive device, said dopants remaining substantially fixed within said memristive device until another programming voltage is applied.

12. The method of claim 11, wherein said memristive device is a variable resistor; an electrical resistance of said variable resistor being altered by said motion of said dopants within said variable resistor.

13. The method of claim 12, further comprising applying said programming voltage to modify a depletion region, said depletion region constricting a conducting cross-section of said variable resistor.

14. The method of claim 12, wherein said variable resistor further comprises a first programming electrode, a second programming electrode, a contact electrode, and a resistive electrode; said first programming electrode and said second programming electrode applying said programming voltage to create a dopant band, said dopant band creating electrical connection between said contact electrode and said resistive electrode, said electrical resistance of said variable resistor varying according to a location of said electrical connection between said contact electrode and said resistive electrode.

15. The method of claim 14, further comprising applying said program voltage across said first and second programming electrodes to move said dopant band to make electrical contact with a different portion of said resistive electrode.

16. A method for increasing a switching speed of the memristive device of claim 1, the method comprising: switching said memristive device to a conductive state by applying a programming voltage which rapidly merges two separate and proximate conductive regions to form a conductive pathway between a source electrode and a drain electrode; said two separate and proximate conductive regions being formed by dopant concentrations within a memristive matrix.

17. The method of claim 16, further comprising:
drawing dopants from two geometrically separated locations to form two conductive regions in close proximity by applying a first programming voltage, said two conductive regions being electrically isolated from each other; and
removing said first programming voltage, said two conductive regions remaining in close proximity to each other.

18. The method of claim 16, further comprising:
removing said programming voltage, said conductive pathway remaining stable until another programming voltage is applied;
conducting a current from said source electrode to said drain electrode; and
returning said memristive device to a nonconductive state by applying a third programming voltage, said third programming voltage having an opposite polarity from said first programming voltage, said third programming voltage separating said conductive pathway into said two conductive regions.

19. The method of claim 16, wherein said source electrode and said drain electrode are separated by an insulating channel, said insulating channel extending into said memristive matrix interposed between said source electrode and said drain electrode.

20. The method of claim 16, wherein said source electrode and said drain electrode further comprise a first array of electrodes and a second array of electrodes, said memristive material being interposed between said first array of electrodes and said second array of electrodes, individual electrodes within said first and second array of electrodes being electrically separated from each other by an insulating channel, said insulating channel extending into said memristive material.

* * * * *

UNITED STATES PATENT AND TRADEMARK OFFICE
CERTIFICATE OF CORRECTION

PATENT NO.        : 8,547,727 B2  
APPLICATION NO.   : 13/119932  
DATED             : October 1, 2013  
INVENTOR(S)       : Wei Wu et al.

Page 1 of 1

It is certified that error appears in the above-identified patent and that said Letters Patent is hereby corrected as shown below:

In the Claims:

In column 20, line 41, in Claim 10, delete "is has" and insert -- has --, therefor.

Signed and Sealed this  
Eighteenth Day of February, 2014

Michelle K. Lee  
*Deputy Director of the United States Patent and Trademark Office*